(12) United States Patent
Kim et al.

(10) Patent No.: US 12,223,910 B2
(45) Date of Patent: Feb. 11, 2025

(54) DISPLAY PANEL

(71) Applicant: Samsung Display Co., Ltd., Yongin-si (KR)

(72) Inventors: Hyewon Kim, Yongin-si (KR); Sungjin Hong, Yongin-si (KR); Yoomin Ko, Yongin-si (KR); Sunho Kim, Yongin-si (KR); Juchan Park, Yongin-si (KR); Pilsuk Lee, Yongin-si (KR); Chung Sock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/490,828

(22) Filed: Oct. 20, 2023

(65) Prior Publication Data

US 2024/0135886 A1 Apr. 25, 2024
US 2024/0233649 A9 Jul. 11, 2024

(30) Foreign Application Priority Data

Oct. 24, 2022 (KR) .................. 10-2022-0137496

(51) Int. Cl.
*G09G 3/3258* (2016.01)
*H10K 59/122* (2023.01)
*H10K 59/124* (2023.01)
*H10K 59/131* (2023.01)

(52) U.S. Cl.
CPC ......... *G09G 3/3258* (2013.01); *H10K 59/122* (2023.02); *H10K 59/124* (2023.02); *H10K 59/131* (2023.02); *G09G 2320/043* (2013.01); *G09G 2340/0457* (2013.01)

(58) Field of Classification Search
CPC .......... G09G 3/3258; G09G 2320/043; G09G 2340/0457; H10K 59/131; H10K 59/122; H10K 59/124
USPC ....................................... 345/204
See application file for complete search history.

(56) References Cited

U.S. PATENT DOCUMENTS 8,648,337 B2 2/2014 Hsieh
10,403,861 B2 9/2019 Lee et al.

FOREIGN PATENT DOCUMENTS

| CN | 103280539 | 9/2013 |
|---|---|---|
| CN | 113972252 | 1/2022 |
| EP | 4 304 319 | 1/2024 |
| JP | 2015-122198 | 7/2015 |
| JP | 2015122198 A * | 7/2015 |

(Continued)

OTHER PUBLICATIONS

Extended European Search Report for European Patent Application No. 23205317.3, dated Feb. 13, 2024.

*Primary Examiner* — Mark Edwards
(74) *Attorney, Agent, or Firm* — KILE PARK REED & HOUTTEMAN PLLC

(57) ABSTRACT

A display panel includes a transistor, a light emitting device electrically connected to the transistor, a connection wiring electrically connecting the transistor to the light emitting device and including side surfaces, a capping pattern disposed on the transistor and contacting at least a side surface among side surfaces, an upper insulating layer disposed on the transistor and including a first opening that overlaps the at least the side surface, and a pixel definition layer disposed on the upper insulating layer and covering the first opening of the upper insulating layer.

20 Claims, 26 Drawing Sheets

(56) References Cited

FOREIGN PATENT DOCUMENTS

KR  10-2016-0006110    1/2016
KR  10-2482991        12/2022

* cited by examiner

DISPLAY PANEL

CROSS-REFERENCE TO RELATED APPLICATIONS

This application claims priority to and benefits of Korean Patent Application No. 10-2022-0137496 under 35 U.S.C. § 119, filed on Oct. 24, 2022 in the Korean Intellectual Property Office, the entire contents of which are incorporated herein by reference.

BACKGROUND

1. Technical Field

The disclosure relates to a display panel. The disclosure relates to a display panel with improved image retention and improved resolution.

2. Description of the Related Art

Multimedia electronic devices, such as televisions, mobile phones, tablet computers, navigation devices, and game devices, include a display panel displaying an image.

The display panel may include light emitting devices and a circuit to drive the light emitting device. The light emitting devices included in the display panel emit a light in response to a voltage applied thereto by the circuit and generate the image. Researches on connections between the light emitting devices and the circuit are being in progress to improve a reliability of the display panel.

SUMMARY

The disclosure provides a display panel with improved image retention and improved resolution.

Embodiments provide a display panel that may include a transistor; a light emitting device electrically connected to the transistor; a connection wiring electrically connecting the transistor to the light emitting device and including side surfaces; a capping pattern disposed on the transistor and contacting at least one side surface among the side surfaces; an upper insulating layer disposed on the transistor and including a first opening that overlaps the at least one side surface; and a pixel definition layer disposed on the upper insulating layer and covering part of the first opening of the upper insulating layer.

A side surface among the side surfaces may be exposed by the first opening, and the capping pattern contacts the one side surface among the side surfaces.

The capping pattern may include a first portion contacting the at least one side surface among the side surfaces and a second portion that does not overlap the upper insulating layer.

The pixel definition layer may include a first slant surface defined in the pixel definition layer covering the second portion of the capping pattern and a second slant surface defined in the pixel definition layer disposed on the upper insulating layer, and a first angle between the upper insulating layer and the first slant surface is greater than a second angle between the upper insulating layer and the second slant surface.

The pixel definition layer may include a slant surface having a stepped shape, and the slant surface may include a first side slant surface defined in the pixel definition layer covering the second portion of the capping pattern, a connection surface extending from the first side slant surface, and a second side slant surface extending from the connection surface.

A taper angle of the first side slant surface may be different from a taper angle of the second side slant surface.

Two side surfaces among the side surfaces may be exposed by the first opening, and the capping pattern contacts the two side surfaces.

The two side surfaces may be connected.

The two side surfaces may be spaced apart from each other in a first direction and extend in a second direction intersecting the first direction.

Three side surfaces among the side surfaces may be exposed by the first opening, and the capping pattern contacts the three side surfaces.

The pixel definition layer may include a second opening overlapping the at least one side surface, and the capping pattern covers the second opening of the pixel definition layer.

Embodiments provide a display panel including a light emitting device; a transistor electrically connected to the light emitting device; a connection wiring including a first connection part electrically connected to the light emitting device and including side surfaces and a second connection part electrically connected to the transistor, an upper insulating layer including a first opening that overlaps at least one side surface among the side surfaces; a capping pattern covering the first connection part; and a pixel definition layer covering an edge of the capping pattern.

The capping pattern may include a first portion contacting the at least one side surface and a second portion that does not overlap the upper insulating layer, the pixel definition layer may include a first slant surface defined in the pixel definition layer covering the second portion of the capping pattern and a second slant surface defined in the pixel definition layer disposed on the upper insulating layer, and a first angle between the upper insulating layer and the first slant surface is greater than a second angle between the upper insulating layer and the second slant surface.

A side surface among the side surfaces may be exposed by the first opening, and the capping pattern contacts the one side surface.

The pixel definition layer comprises a slant surface having a stepped shape, the slant surface may include a first side slant surface defined in the pixel definition layer covering a second portion of the capping pattern, a connection surface extending from the first side slant surface, and a second side slant surface extending from the connection surface, and the first side slant surface has a taper angle different from a taper angle of the second side slant surface.

Two side surfaces connected to each other among the side surfaces may be exposed by the first opening, and the capping pattern contacts the two side surfaces.

Two side surfaces among the side surfaces may be exposed by the first opening, the capping pattern contacts the two side surfaces, and the two side surfaces are spaced apart from each other in a first direction and extend in a second direction intersecting the first direction.

Three side surfaces among the side surfaces may be exposed by the first opening, and the capping pattern contacts the three side surfaces.

Embodiments provide a display panel including a transistor; a light emitting device electrically connected to the transistor; a connection wiring electrically connecting the transistor to the light emitting device and including side surfaces; a lower insulating layer disposed on the transistor; an upper insulating layer disposed on the lower insulating layer and including a first opening defined therethrough that overlaps at least one side surface among the side surfaces of the connection wiring; and a pixel definition layer disposed on the upper insulating layer. The pixel definition layer may include a first slant surface covering a portion of the first opening and a second slant surface disposed on the upper insulating layer, and a first angle between the lower insulating layer and the first slant surface is greater than a second angle between the upper insulating layer and the second slant surface.

The display panel further may include a capping pattern disposed on the lower insulating layer and contacting at least one side surface among the side surfaces.

According to the above, a gate-source voltage of the transistor is prevented from being varied. Accordingly, a range of change in an amount of current due to deterioration of the light emitting device is reduced, an image retention defect of the display panel according to an increase in usage time is reduced, and thus, a lifespan of the display is improved. As the display panel further may include the connection wiring connecting the light emitting device and a pixel circuit, the light emitting device is stably connected to the pixel circuit by changing only a shape of a cathode without changing a design of emitting parts. Thus, influences of the arrangement or shape of the emitting parts on the connection with the pixel circuit is reduced, a degree of freedom in designing the pixel circuit is improved, and a decrease in aperture ratio of the emitting part is prevented.

According to the above, the capping pattern is spaced apart from a portion of a side surface of the upper insulating layer, and the pixel definition layer has a structure that covers the portion of the upper insulating layer. Accordingly, a length of the capping pattern is shortened compared with a case that the capping pattern covers the side surface of the upper insulating layer. As a portion of the capping pattern is covered by the pixel definition layer, a size of opening defined through the pixel definition layer decreases. Accordingly, an area in which the pixel is disposed is able to be secured more in the display panel, and a resolution of the display panel is enhanced.

According to the above, as the capping pattern does not cover the upper insulating layer, a gas generated from the upper insulating layer is not blocked by the capping pattern and is readily dissipated. Since the gas generated during a process is readily dissipated, a lifespan of the pixel is improved.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
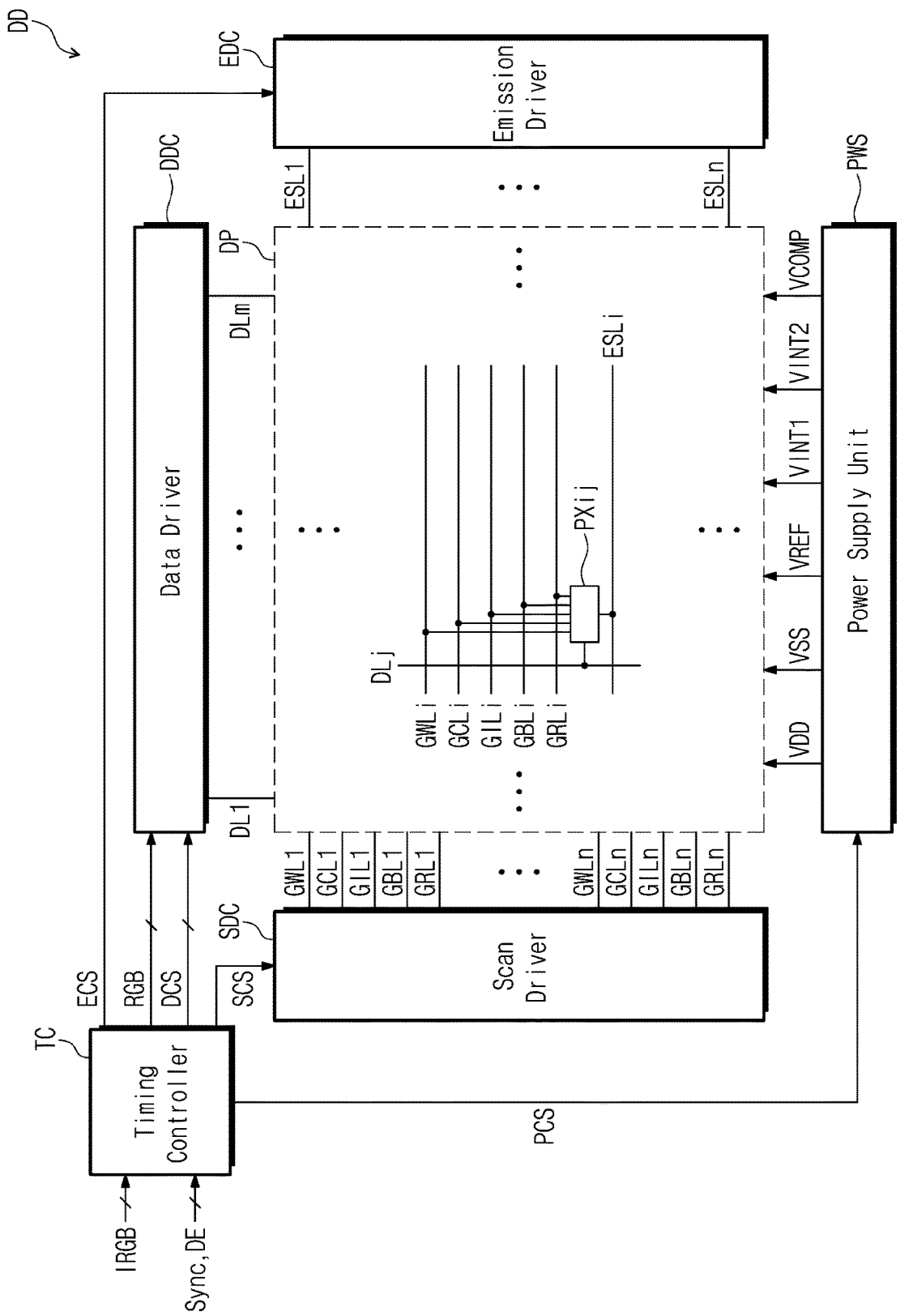
FIG. 1 is a block diagram of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings.

As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The term "part" or "unit" as used herein is intended to mean a software component or a hardware component that performs a given function. The hardware component may include, for example, a field-programmable gate array (FPGA) or an application-given integrated circuit (ASIC). The software component may refer to an executable code and/or data used by the executable code in an addressable storage medium. Thus, the software components may be, for example, object-oriented software components, class components, and task components, and may include processes, functions, attributes, procedures, subroutines, segments of program code, drivers, firmware, micro codes, circuits, data, a database, data structures, tables, arrays, or variables.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "overlap" or "overlapped" means that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to accompanying drawings.

FIG. 1 is a block diagram of a display device DD according to an embodiment.

Referring to FIG. 1, the display device DD may include a timing controller TC, a panel driver, and a display panel DP. The display panel DP may be a light-emitting type display panel. The light-emitting type display panel DP may be an organic light emitting display panel, an inorganic light emitting display panel, or a quantum dot light emitting display panel. Hereinafter, the organic light emitting display panel will be described as a representative example of the display panel DP. The panel driver may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. Each of "m" and "n" is an integer number greater than 1.

As an example, a pixel PXij (each of "i" and "j" is an integer number greater than 1) positioned to correspond to an i-th horizontal line (or an i-th pixel row) and a j-th vertical line (or a j-th pixel column) may be connected to an i-th first scan line GWL1, an i-th second scan line GCLi, an i-th third scan line GILi, an i-th fourth scan line GBLi, an i-th fifth scan line GRLi, a j-th data line DLj, and an i-th emission line ESLi.

The pixel PXij may include transistors and capacitors. The pixel PXij may receive a first power supply voltage (or a first driving voltage) VDD, a second power supply voltage (or a second driving voltage) VSS, a third power supply voltage (or a reference voltage) VREF, a fourth power supply voltage (or a first initialization voltage) VINT1, a fifth power supply voltage (or a second initialization voltage) VINT2, and a sixth power supply voltage (or a compensation voltage) VCOMP from a power supply unit PWS.

The first power supply voltage VDD and the second power supply voltage VSS may have a voltage value set to allow a current to flow through the light emitting device, and thus a light may be emitted from the light emitting device. As an example, the first power supply voltage VDD may be set to have a voltage level higher than that of the second power supply voltage VSS.

The third power supply voltage VREF may be a voltage to initialize a gate of a driving transistor included in the pixel PXij. The third power supply voltage VREF may be used to implement a grayscale (e.g., a predetermined or selectable grayscale) using a difference in voltage between the third power supply voltage VREF and a data signal. To this end, the third power supply voltage VREF may be set to a voltage within a voltage range of the data signal.

The fourth power supply voltage VINT1 may be used to initialize the capacitor included in the pixel PXij. The fourth power supply voltage VINT1 may be set to a voltage level lower than that of the third power supply voltage VREF. As an example, the fourth power supply voltage VINT1 may be set to a voltage level lower than a difference between the third power supply voltage VREF and a threshold voltage (Vth) of the driving transistor. As an example, the fourth power supply voltage VINT1 may have a voltage level equal to or greater than about 4 volts and equal to or smaller than about 12 volts. In case that the fourth power supply voltage VINT1 is set to an electric potential equal to or greater than about 4 volts, characteristics of an N-type transistor may be readily overcome, however, the disclosure should not be limited thereto or thereby.

The fifth power supply voltage VINT2 may be used to initialize a cathode of the light emitting device LD (refer to FIG. 2A or 2B) included in the pixel PXij.

The sixth power supply voltage VCOMP may provide a current (e.g., a predetermined or selectable current) to the driving transistor in case that the threshold voltage of the driving transistor is compensated for. The fifth power supply voltage VINT2 may be set to a voltage level lower than the first power supply voltage VDD or the fourth power supply voltage VINT1 or may be set to a voltage level similar to or the same as the third power supply voltage VREF, however, it should not be limited thereto or thereby. The fifth power supply voltage VINT2 may be set to a voltage level similar to or the same as the first power supply voltage VDD.

FIG. 1 shows a structure in which all the first, second, third, fourth, fifth, and sixth power supply voltages VDD, VSS, VREF, VINT1, VINT2, and VCOMP are provided from the power supply unit PWS, however, the disclosure should not be limited thereto or thereby. As an example, both of the first power supply voltage VDD and the second power supply voltage VSS may be provided regardless of the structure of the pixel PXij, and at least one of the third power supply voltage VREF, the fourth power supply voltage VINT1, the fifth power supply voltage VINT2, and the sixth power supply voltage VCOMP may not be provided according to the structure of the pixel PXij.

According to the disclosure, signal lines connected to the pixel PXij may be designed in various ways by taking into account the structure of the pixel PXij.

The scan driver SDC may receive a first control signal SCS from the timing controller TC and may provide a scan signal to the first scan lines GWL1 to GWLn, the second scan lines GCL1 to GCLn, the third scan lines GIL1 to GILn, the fourth scan lines GBL1 to GBLn, and the fifth scan lines GRL1 to GRLn in response to the first control signal SCS.

The scan signal may be set to a gate-on-voltage to allow the transistors to be turned on in response to the scan signal.

As an example, the scan signal provided to a P-type transistor may be set to a logic low level, and the scan signal provided to an N-type transistor may be set to a logic high level. Hereinafter, the expression "the scan signal is provided" may mean that the scan signal is provided to the transistor, which is controlled thereby, with a logic level that turns on the transistor.

For the convenience of explanation, FIG. 1 shows one scan driver SDC, however, the disclosure should not be limited thereto or thereby. According to an embodiment, the display device DD may include multiple scan drivers to provide the scan signal to the first scan lines GWL1 to GWLn, the second scan lines GCL1 to GCLn, the third scan lines GILL to GILn, the fourth scan lines GBL1 to GBLn, and the fifth scan lines GRL1 to GRLn.

The emission driver EDC may provide emission signals to the emission lines ESL1 to ESLn in response to a second control signal ECS. As an example, the emission signals may be sequentially provided to the emission lines ESL1 to ESLn.

Each transistor connected to the emission lines ESL1 to ESLn may be the N-type transistor. The emission signals provided to the emission lines ESL1 to ESLn may have a gate-off voltage, for example, the logic low level. The transistors receiving the emission signal may be turned off in case that receiving the emission signal and may be turned on in other cases.

The second control signal ECS may include an emission start signal and clock signals, and the emission driver EDC may be implemented by a shift register that sequentially shifts the emission start signal with a pulse shape using the clock signals to sequentially generate and output the emission signal with a pulse shape.

The data driver DDC may receive a third control signal DCS and image data RGB from the timing controller TC. The data driver DDC may convert the image data RGB in a digital form to analog data signals. The data driver DDC may provide the data signal to the data lines DL1 to DLm in response to the third control signal DCS.

The third control signal DCS may include a data enable signal, a horizontal start signal, and a data clock signal to indicate an output of an effective data signal. As an example, the data driver DDC may include a shift register that shifts the horizontal start signal in synchronization with the data clock signal to generate a sampling signal, a latch that latches the image data RGB in response to the sampling signal, a digital-analog converter (or a decoder) that converts the latched image data, for example, data in the digital form to data signals in the analog form, and buffers (or amplifiers) that output the data signals to the data lines DL1 to DLm.

The power supply unit PWS may provide the first power supply voltage VDD, the second power supply voltage VSS, the third power supply voltage VREF to the display panel DP to drive the pixel PXij. The power supply unit PWS may provide at least one voltage of the fourth power supply voltage VINT1 and the fifth power supply voltage VINT2 to the display panel DP.

Figure 2A:
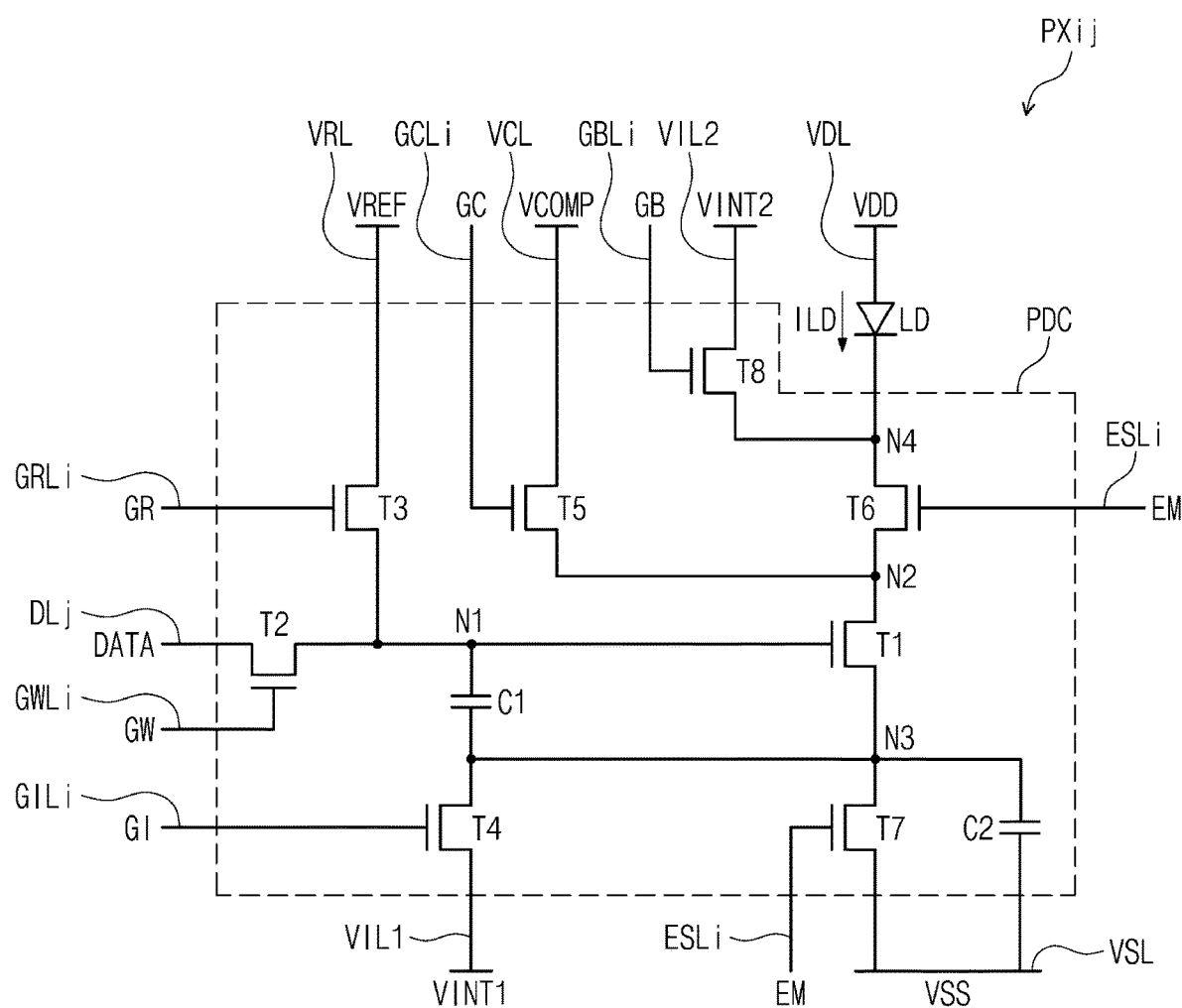
FIGS. 2A and 2B are schematic diagrams of equivalent circuit diagrams of pixels according to an embodiment.

As an example, the power supply unit PWS may provide the first power supply voltage VDD, the second power supply voltage VSS, the third power supply voltage VREF, the fourth power supply voltage VINT1, the fifth power supply voltage VINT2, and the sixth power supply voltage VCOMP to the display panel DP respectively via a first power line (or a first driving voltage line) VDL, a second power line (or a second driving voltage line) VSL, a third power line (or the reference voltage line) VRL, a fourth power line (or a first initialization voltage line) VIL1, a fifth power line (or a second initialization voltage line) VIL2, and a sixth power line (or a compensation voltage line) VCL, which are shown in FIG. 2A.

The power supply unit PWS may be implemented by a power management IC (PMIC), however, the disclosure should not be limited thereto or thereby.

The timing controller TC may generate the first control signal SCS, the second control signal ECS, the third control signal DCS, and a fourth control signal PCS based on input image data IRGB, a synchronization signal Sync, for example, a vertical synchronization signal, a horizontal synchronization signal, etc., a data enable signal DE, and a clock signal. The first control signal SCS may be applied to the scan driver SDC, the second control signal ECS may be applied to the emission driver EDC, the third control signal DCS may be applied to the data driver DDC, and the fourth control signal PCS may be applied to the power supply unit PWS. The timing controller TC may rearrange the input image data IRGB to correspond to an arrangement of the pixel PXij in the display panel DP and may generate the image data RGB (or frame data).

The scan driver SDC, the emission driver EDC, the data driver DDC, the power supply unit PWS, and/or the timing controller TC may be directly formed in the display panel DP or may be connected to the display panel DP after being manufactured in a separate driving chip. At least two of the scan driver SDC, the emission driver EDC, the data driver DDC, the power supply unit PWS, and the timing controller TC may be provided in a single driving chip. As an example, the data driver DDC and the timing controller TC may be provided in the single driving chip.

In the above descriptions, the display device DD is described with reference to FIG. 1, however, the display device DD should not be limited thereto or thereby. Signal lines may be added or omitted depending on the structure of the pixels. A connection relationship between one pixel and the signal lines may be changed. In a case where one of the signal lines may be omitted, the omitted signal line may be replaced with another signal line.

Figure 2B:
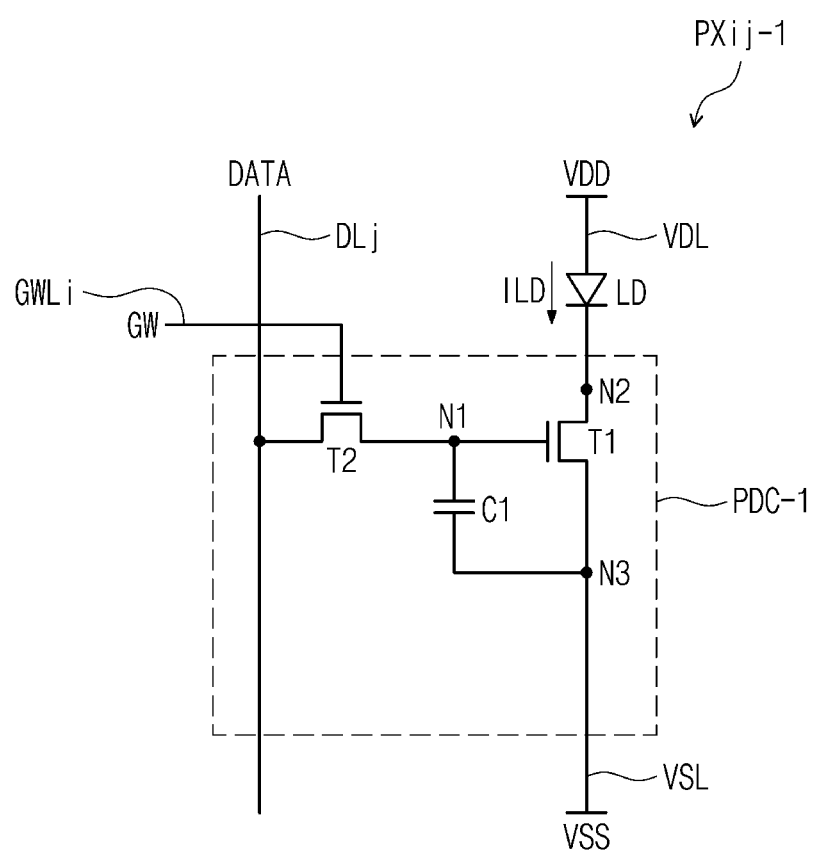

FIGS. 2A and 2B are schematic diagrams of equivalent circuit diagrams of pixels PXij and PXij-1 according to an embodiment. FIGS. 2A and 2B show the equivalent circuit diagrams of the pixels PXij and PXij-1, which are connected to the i-th first scan line GWLi (hereinafter, referred to as a first scan line) and the j-th data line DLj (hereinafter, referred to as a data line).

Referring to FIG. 2A, the pixel PXij may include a light emitting device LD and a pixel driver PDC. The light emitting device LD may be connected to the first driving voltage line VDL and the pixel driver PDC.

The pixel driver PDC may be connected to the scan lines GWLi, GCLi, GILi, GBLi, and GRLi, the data line DLj, the emission line ESLi, and the power lines VDL, VSL, VIL1, VIL2, VRL, and VCL. The pixel driver PDC may include first, second, third, fourth, fifth, sixth, seventh, and eighth transistors T1, T2, T3, T4, T5, T6, T7, and T8, a first capacitor C1, and a second capacitor C2. Hereinafter, each of the first, second, third, fourth, fifth, sixth, seventh, and eighth transistors T1, T2, T3, T4, T5, T6, T7, and T8 will be described as the N-type transistor, however, the disclosure should not be limited thereto or thereby. According to an embodiment, some or a number of the first to eighth transistors T1 to T8 may be the N-type transistor, and the other of the first to eighth transistors T1 to T8 may be the P-type transistor, or each of the first to eighth transistors T1 to T8 may be the P-type transistor, and the disclosure should not be particularly limited.

A gate of the first transistor T1 may be connected to a first node Ni. A first electrode of the first transistor T1 may be connected to a second node N2, and a second electrode of the first transistor T1 may be connected to a third node N3. The first transistor T1 may be a driving transistor. The first transistor T1 may control a driving current ILD flowing from the first driving voltage line VDL to the second driving voltage line VSL via the light emitting device LD in response to a voltage of the first node N1. The first driving voltage VDD may be set to a voltage with an electric potential higher than the second driving voltage VSS.

In the disclosure, the expression "the transistor is electrically connected to the signal line or the transistor is electrically connected to the transistor" may mean that a source, drain, or gate of the transistor may be integral with the signal line (or transistor) or connected to the signal line (or transistor) via a connection electrode.

The second transistor T2 may include a gate connected to the first scan line GWLi, a first electrode connected to the data line DLj, and a second electrode connected to the first node N1. The second transistor T2 may provide a data signal DATA to the first node N1 in response to a write scan signal GW applied thereto via the first scan line GWLi. The second transistor T2 may be a switching transistor. The second transistor T2 may be turned on in case that the write scan signal GW is applied to the first scan line GWLi, and thus, the data line DLj may be electrically connected to the first node N1.

The third transistor T3 may be connected between the first node N1 and the reference voltage line VRL. A first electrode of the third transistor T3 may receive the reference voltage VREF via the reference voltage line VRL, and a second electrode of the third transistor T3 may be connected to the first node N1. In an embodiment, a gate of the third transistor T3 may receive a reset scan signal GR via the i-th fifth scan line GRLi (hereinafter, referred to as a fifth scan line). The third transistor T3 may be turned on in case that the reset scan signal GR is applied to the fifth scan line GRLi and may provide the reference voltage VREF to the first node N1.

The fourth transistor T4 may be connected between the third node N3 and the first initialization voltage line VIL1. A first electrode of the fourth transistor T4 may be connected to the third node N3, and a second electrode of the fourth transistor T4 may be connected to the first initialization voltage line VIL1 through which the first initialization voltage VINT1 is provided. A gate of the fourth transistor T4 may receive an initialization scan signal GI via the i-th third scan line GILi (hereinafter, referred to as a third scan line). The fourth transistor T4 may be turned on in case that the initialization scan signal GI is provided to the third scan line GILi and may provide the first initialization voltage VINT1 to the third node N3.

The fifth transistor T5 may be connected between the compensation voltage line VCL and the second node N2. A first electrode of the fifth transistor T5 may receive the compensation voltage VCOMP via the compensation voltage line VCL, and a second electrode of the fifth transistor T5 may be connected to the second node N2 to be electrically connected to the first electrode of the first transistor T1. A gate of the fifth transistor T5 may receive a compensation scan signal GC via the i-th second scan line GCLi (hereinafter, referred to as a second scan line). The fifth transistor T5 may be turned on in case that the compensation scan signal GC is provided to the second scan line GCLi and may provide the compensation voltage VCOMP to the second node N2, and thus, the threshold voltage (Vth) of the first transistor T1 may be compensated for during a compensation period.

The sixth transistor T6 may be connected between the first transistor T1 and the light emitting device LD. In detail, a gate of the sixth transistor T6 may receive the emission signal EM via the i-th emission line ESLi (hereinafter, referred to as an emission line). A first electrode of the sixth transistor T6 may be connected to the cathode of the light emitting device LD via a fourth node N4, and a second electrode of the sixth transistor T6 may be connected to the first electrode of the first transistor T1 via the second node N2. The sixth transistor T6 may be referred to as a first emission control transistor. The sixth transistor T6 may be turned on in case that the emission signal EM is provided to the emission line ESLi, and thus, the light emitting device LD may be electrically connected to the first transistor T1.

The seventh transistor T7 may be connected between the second driving voltage line VSL and the third node N3. A first electrode of the seventh transistor T7 may be connected to the second electrode of the first transistor Ti via the third node N3, and a second electrode of the seventh transistor T7 may receive the second driving voltage VSS via the second driving voltage line VSL. A gate of the seventh transistor T7 may be electrically connected to the emission line ESLi. The seventh transistor T7 may be referred to as a second emission control transistor. The seventh transistor T7 may be turned on in case that the emission signal EM is provided to the emission line ESLi, and thus, the first electrode of the first transistor T1 may be electrically connected to the second driving voltage line VSL.

According to an embodiment, the sixth transistor T6 and the seventh transistor T7 are connected to the same emission line ESLi and may be turned on in response to the same emission signal EM, however, this is an example. According to an embodiment, the sixth transistor T6 and the seventh transistor T7 may be independently turned on in response to different signals distinguished from each other. According to an embodiment, one of the sixth transistor T6 and the seventh transistor T7 may be omitted from the pixel driver PDC.

The eighth transistor T8 may be connected between the second initialization voltage line VIL2 and the fourth node N4. For example, the eighth transistor T8 may include a gate connected to the i-th fourth scan line GBLi (hereinafter, referred to as a fourth scan line), a first electrode connected to the second voltage initialization line VIL2, and a second electrode connected to the fourth node N4. The eighth transistor T8 may provide the second initialization voltage VINT2 to the fourth node N4 corresponding to the cathode of the light emitting device LD in response to a black scan signal GB applied thereto via the fourth scan line GBLi. The cathode of the light emitting device LD may be initialized by the second initialization voltage VINT2.

According to an embodiment, some or a number of the second, third, fourth, fifth, sixth, seventh, and eighth transistors T2, T3, T4, T5, T6, T7, and T8 may be substantially simultaneously turned on in response to the same scan signal. As an example, the eighth transistor T8 and the fifth transistor T5 may be substantially simultaneously turned on in response to the same scan signal. As an example, the eighth transistor T8 and the fifth transistor T5 may be operated in response to the same compensation scan signal GC. Since the eighth transistor T8 and the fifth transistor T5 are turned on and off in response to the same compensation scan signal GC, the eighth transistor T8 and the fifth transistor T5 may be substantially simultaneously turned on and off. The second scan line GCLi and the fourth scan line GBLi may be substantially provided as a single scan line. Accordingly, the initialization of the cathode of the light emitting device LD and the compensation of the threshold voltage of the first transistor T1 may be performed at the same timing, however, the disclosure should not be limited thereto or thereby.

According to the disclosure, the initialization of the cathode of the light emitting device LD and the compensation of the threshold voltage of the first transistor T1 may be performed in response to the same power voltage. As an example, the compensation voltage line VCL and the second initialization voltage line VIL2 may be substantially provided as a single power line. The initialization operation of the cathode and the compensation operation of the driving transistor may be performed using one power voltage, and thus, a design for the drivers may be simplified, however, the disclosure should not be particularly limited.

The first capacitor C1 may be disposed between the first node N1 and the third node N3. The first capacitor C1 may be charged with a voltage corresponding to a difference between the voltage of the first node N1 and the voltage of the third node N3. The first capacitor C1 may be referred to as a storage capacitor.

The second capacitor C2 may be disposed between the third node N3 and the second driving voltage line VSL. For example, one electrode of the second capacitor C2 may be connected to the second driving voltage line VSL receiving the second driving voltage VSS, and the other electrode of the second capacitor C2 may be connected to the third node N3. The second capacitor C2 may be charged with electric charges corresponding to a difference in voltage between the second power supply voltage VSS and the second node N2. The second capacitor C2 may be referred to as a hold capacitor. The second capacitor C2 may have a higher storage capacity compared with the first capacitor C1. Accordingly, the second capacitor C2 may reduce a variation in voltage of the third node N3 according to a variation in voltage of the first node N1.

In an embodiment, the light emitting device LD may be connected to the pixel driver PDC via the fourth node N4. The light emitting device LD may include an anode connected to the first driving voltage line VDL and the cathode opposite to the anode. In an embodiment, the light emitting device LD may be connected to the pixel driver PDC through the cathode thereof. For example, according to the pixel PXij, a connection node at which the light emitting device LD is connected to the pixel driver PDC may be the fourth node N4, and the fourth node N4 may correspond to a connection node between the first electrode of the sixth transistor T6 and the cathode of the light emitting device LD.

Accordingly, an electric potential of the fourth node N4 may correspond to an electric potential of the cathode of the light emitting device LD. For example, the anode of the light emitting device LD may be connected to the first driving voltage line VDL, the first driving voltage VDD that is a constant voltage may be applied to the anode, the cathode may be electrically connected to the first transistor Ti via the sixth transistor T6, and the electric potential of the cathode may be controlled. For example, an electric potential of the second node N2 corresponding to a source of the first transistor T1 may not be directly affected by characteristics of the light emitting device LD. Accordingly, even though the characteristics of the light emitting device LD are deteriorated due to a lifespan of the light emitting device LD, an influence of the deterioration in the characteristics of the light emitting device LD on a gate-source voltage (Vgs) of the transistors constituting the pixel driver PDC, especially the driving transistor, may be reduced. For example, since a range of change in an amount of current due to the deterioration of the light emitting device may be reduced, an image retention defect of the display panel according to the increase in usage time may be reduced, and a lifespan of the display panel may be improved.

As shown in FIG. 2B, the pixel PXij-1 may include a pixel driver PDC-1 including two transistors T1 and T2 and one capacitor C1. The pixel driver PDC-1 may be connected to a light emitting device LD, a first scan line GWLi, a data line DLj, and a second driving voltage line VSL. The pixel driver PDC-1 shown in FIG. 2B may correspond to a circuit configuration obtained by removing the third to eighth transistors T3 to T8 and one capacitor C2 from the pixel driver PDC shown in FIG. 2A.

Each of the first and second transistors T1 and T2 may be an N-type transistor or a P-type transistor. In an embodiment, each of the first and second transistors T1 and T2 will be described as the N-type transistor.

The first transistor T1 may include a gate connected to a first node N1, a first electrode connected to a second node N2, and a second electrode connected to a third node N3. The second node N2 may be connected to a first driving voltage line VDL, and the third node N3 may be connected to the second driving voltage line VSL. The first transistor T1 may be connected to the light emitting device LD via the second node N2 and may be connected to the second driving voltage line VSL via the third node N3. The first transistor T1 may be a driving transistor.

The second transistor T2 may include a gate receiving a write scan signal GW via a first scan line GWLi, a first electrode connected to the data line DLj, and a second electrode connected to the first node N1. The second transistor T2 may provide a data signal DATA to the first node N1 in response to the write scan signal GW applied thereto via the first scan line GWLi.

The capacitor C1 may include an electrode connected to the first node N1 and an electrode connected to the third node N3. The capacitor C1 may be charged with the data signal DATA applied to the first node N1.

The light emitting device LD may include an anode and a cathode. In an embodiment, the anode of the light emitting device LD may be connected to the first driving voltage line VDL, and the cathode of the light emitting device LD may be connected to the pixel driver PDC-1 via the second node N2. In an embodiment, the cathode of the light emitting device LD may be connected to the first transistor T1. The light emitting device LD may emit a light in response to an amount of current flowing through the first transistor T1 of the pixel driver PDC-1.

The second node N2 at which the cathode of the light emitting device LD is connected to the pixel driver PDC-1 may correspond to a drain of the first transistor T1. The light emitting device LD may be connected to the pixel driver PDC-1 via the second node N2. For example, in the pixel PXij-1 shown in FIG. 2B, a connection node at which the light emitting device LD is connected to the pixel driver PDC-1 may be the second node N2, and the second node N2 may correspond to a connection node between the first electrode of the first transistor T1 and the cathode of the light emitting device LD.

For example, in the case where the driving transistor is the N-type transistor, the display panel may prevent a variation in a gate-source voltage of the first transistor T1, which is caused by the light emitting device LD. Accordingly, the range of change in the amount of current due to deterioration of the light emitting device LD may be reduced, the image retention defect of the display panel according to the increase in usage time may be reduced, and the lifespan of the display panel may be improved.

FIGS. 2A and 2B show the circuit configurations of the pixel drivers PDC and PDC-1 according to embodiments. In the disclosure, the display panel should not be particularly limited, and the number and arrangement of the transistors and the number and arrangement of the capacitors may be designed in various ways as long as a circuit is connected to the cathode of the light emitting device LD.

Figure 3A:
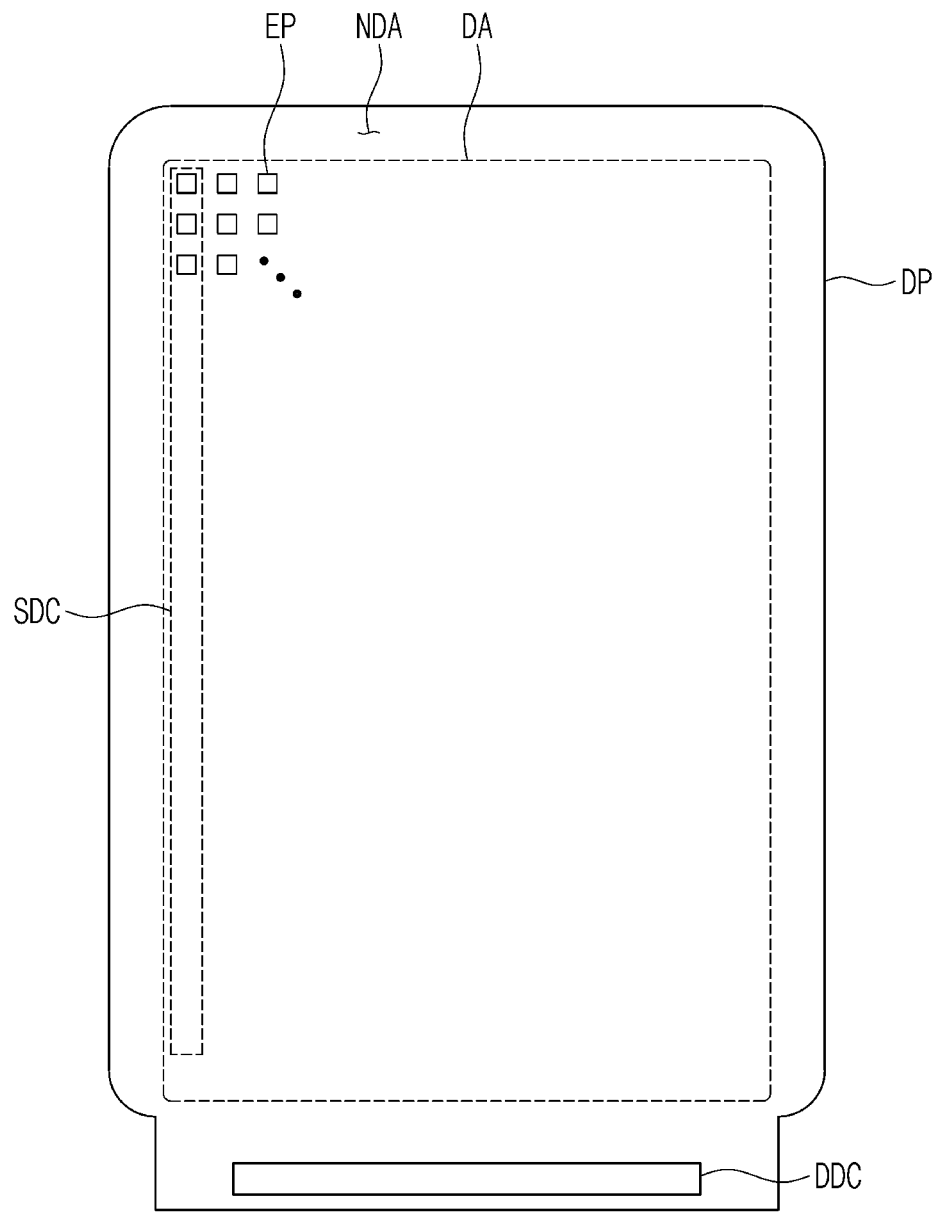
FIGS. 3A and 3B are schematic plan views of display panels according to embodiments.
Figure 3B:
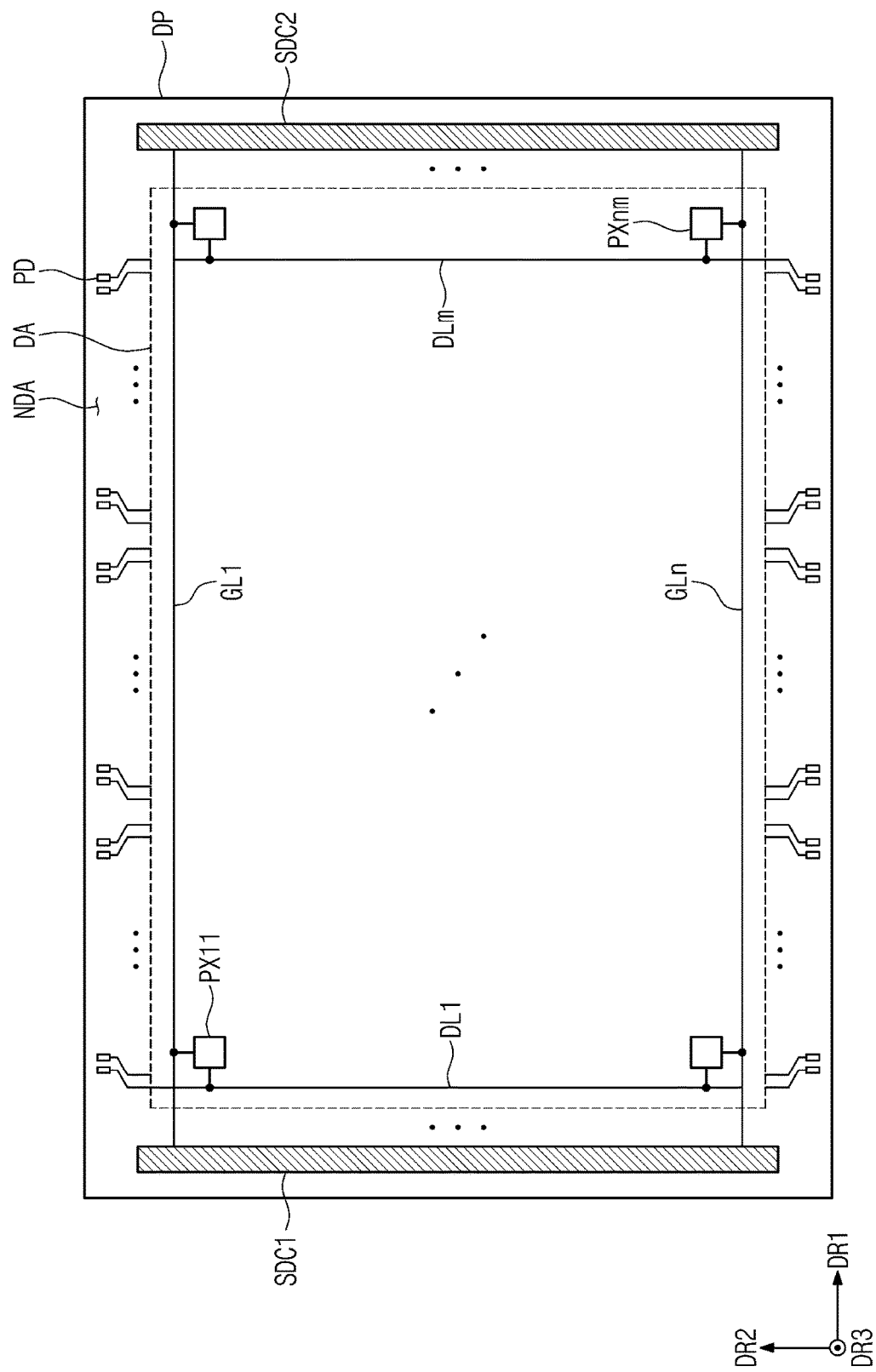

FIGS. 3A and 3B are schematic plan views of display panels DP according to embodiments. In FIGS. 3A and 3B, some or a number of components may be omitted, and for the convenience of explanation, some or a number of components mounted on the display panel DP are not omitted. Hereinafter, the disclosure will be described with reference to FIGS. 3A and 3B. Referring to FIG. 3A, the display panel DP may include a display area DA and a peripheral area NDA. The display area DA may include emitting parts EP.

The emitting parts EP may be areas where the pixels PX11~PXnm emit the light. In detail, each of the emitting parts EP may correspond to a light emitting opening OP-PDL described later.

The peripheral area NDA may be defined adjacent to the display area DA. In an embodiment, the peripheral area NDA may have a shape surrounding an edge of the display area DA, however, this is an example. According to an embodiment, the peripheral area NDA may be defined adjacent to one side or a side of the display area DA or may be omitted.

In an embodiment, a scan driver SDC and a data driver DDC may be mounted on the display panel DP. The scan driver SDC may be disposed in the display area DA, and the data driver DDC may be disposed in the peripheral area NDA. The scan driver SDC may overlap some or a number of the emitting parts EP arranged or disposed in the display area DA when viewed in a plan view. As the scan driver SDC is disposed in the display area DA, a size of the peripheral area NDA may be reduced compared with that of a conventional display panel in which a scan driver is disposed in a peripheral area, and thus, a narrow bezel of the display device may be readily implemented.

FIG. 3A shows one scan driver SDC as a representative example, however, the disclosure should not be limited thereto or thereby. As an example, the scan driver SDC may be provided in two parts distinguished from each other. The two scan drivers SDC may be respectively disposed at left and right sides of the display area DA and may be spaced apart from each other. According to an embodiment, three or more scan drivers SDC may be employed, but the number of the scan drivers SDC should not be particularly limited.

FIG. 3A shows a representative example of the display device, however, the data driver DDC may be disposed in the display area DA. In case that the data driver DDC is disposed in the display area DA, some or a number of the emitting parts EP arranged or disposed in the display area may overlap the data driver DDC when viewed in the plan view.

The data driver DDC may be provided in a separate driving chip independently formed from the display panel DP and may be connected to the display panel DP, however, this is an example. According to an embodiment, the data driver DDC may be formed through the same process as the scan driver SDC to form the display panel DP, and it should not be limited thereto or thereby.

Referring to FIG. 3B, the display device may include the display panel DP having long sides extending in a first direction DR1. In an embodiment, the display device may include scan drivers SDC1 and SDC2. The scan drivers SDC1 and SDC2 may include a first scan driver SDC1 and a second scan driver SDC2, which are spaced apart from each other in the first direction DR1.

The first scan driver SDC1 may be connected to some or a number of scan lines of scan lines GL1 to GLn, and the second scan driver SDC2 may be connected to the other scan lines among the scan lines GL1 to GLn. As an example, the first scan driver SDC1 may be connected to odd-numbered scan lines among the scan lines GL1 to GLn, and the second scan driver SDC2 may be connected to even-numbered scan lines among the scan lines GL1 to GLn.

For the convenience of explanation, FIG. 3B shows pads PD of data lines DL1 to DLm. The pads PD may be placed at ends of the data lines DL1 to DLm. The data lines DL1 to DLm may be connected to the data driver DDC (refer to FIG. 3A) via the pads PD.

According to the disclosure, the pads PD may be arranged or disposed in areas of the peripheral area NDA, which are spaced apart from each other with the display area DA interposed therebetween. As an example, some or a number of pads among the pads PD may be arranged or disposed in an upper portion of the display panel DP, which is adjacent to a first scan line GL1 among the scan lines GL1 to GLn, and the other pads among the pads PD may be arranged or disposed in a lower portion of the display panel DP, which is adjacent to the last scan line GLn among the scan lines GL1 to GLn. In an embodiment, pads, which are connected to odd-numbered data lines, among the pads PD may be arranged or disposed in the upper portion, and pads among the pads PD, which are connected to even-numbered data lines, may be arranged or disposed in the lower portion. Although not shown in figures, the data driver may include three upper data drivers connected to the pads PD arranged or disposed in the upper portion and three lower data drivers connected to the pads PD arranged or disposed in the lower portion, however, these are examples. According to an embodiment, the pads PD may be connected to two data drivers respectively arranged or disposed in the upper and lower portions. According to an embodiment, the pads PD may be arranged or disposed in one side portion or a side portion and may be connected to a single data driver, however, the disclosure should not be particularly limited.

Figure 4A:
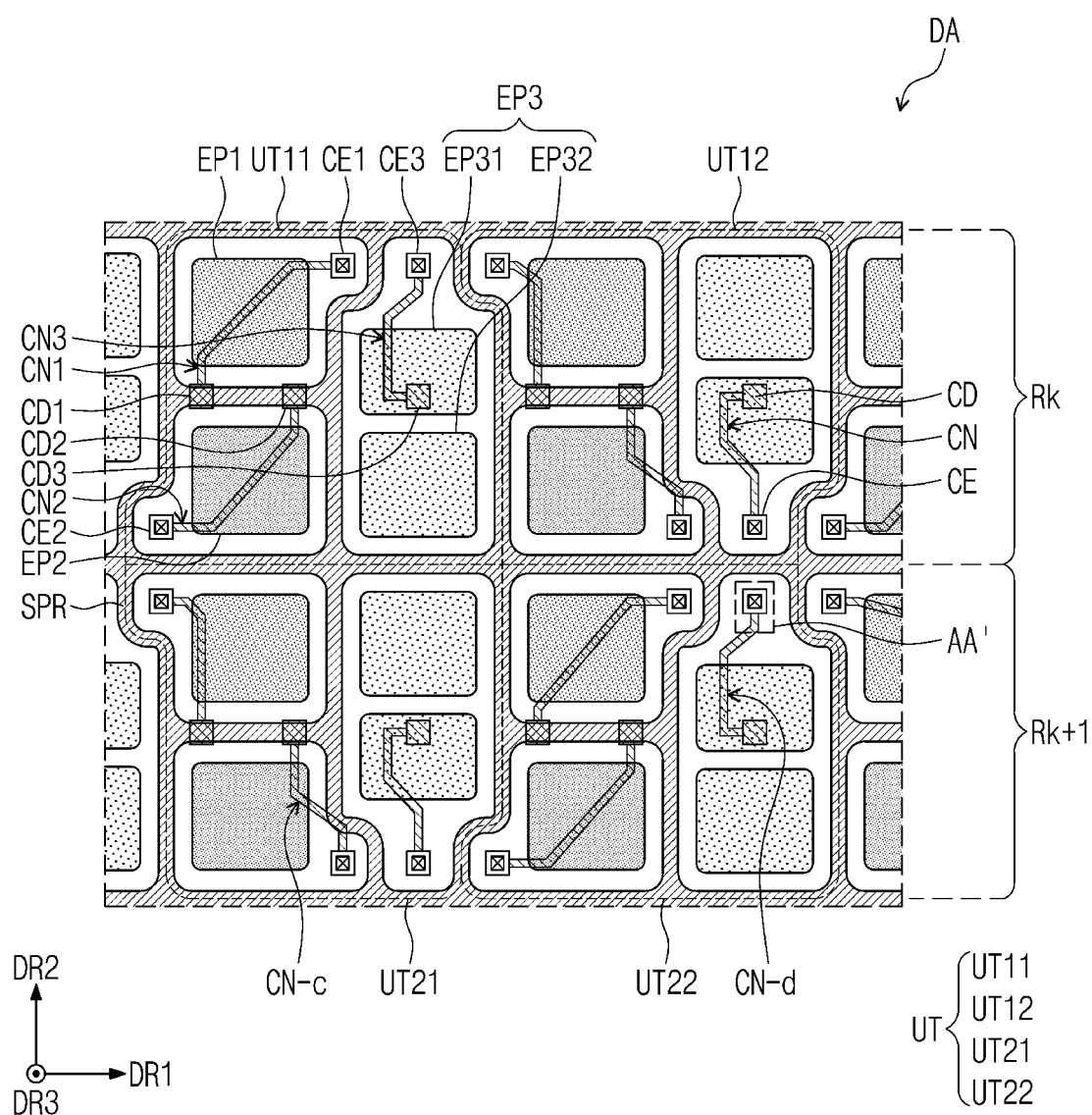
FIGS. 4A to 4C are enlarged schematic plan views of some or a number of areas of a display panel according to an embodiment.
Figure 4B:
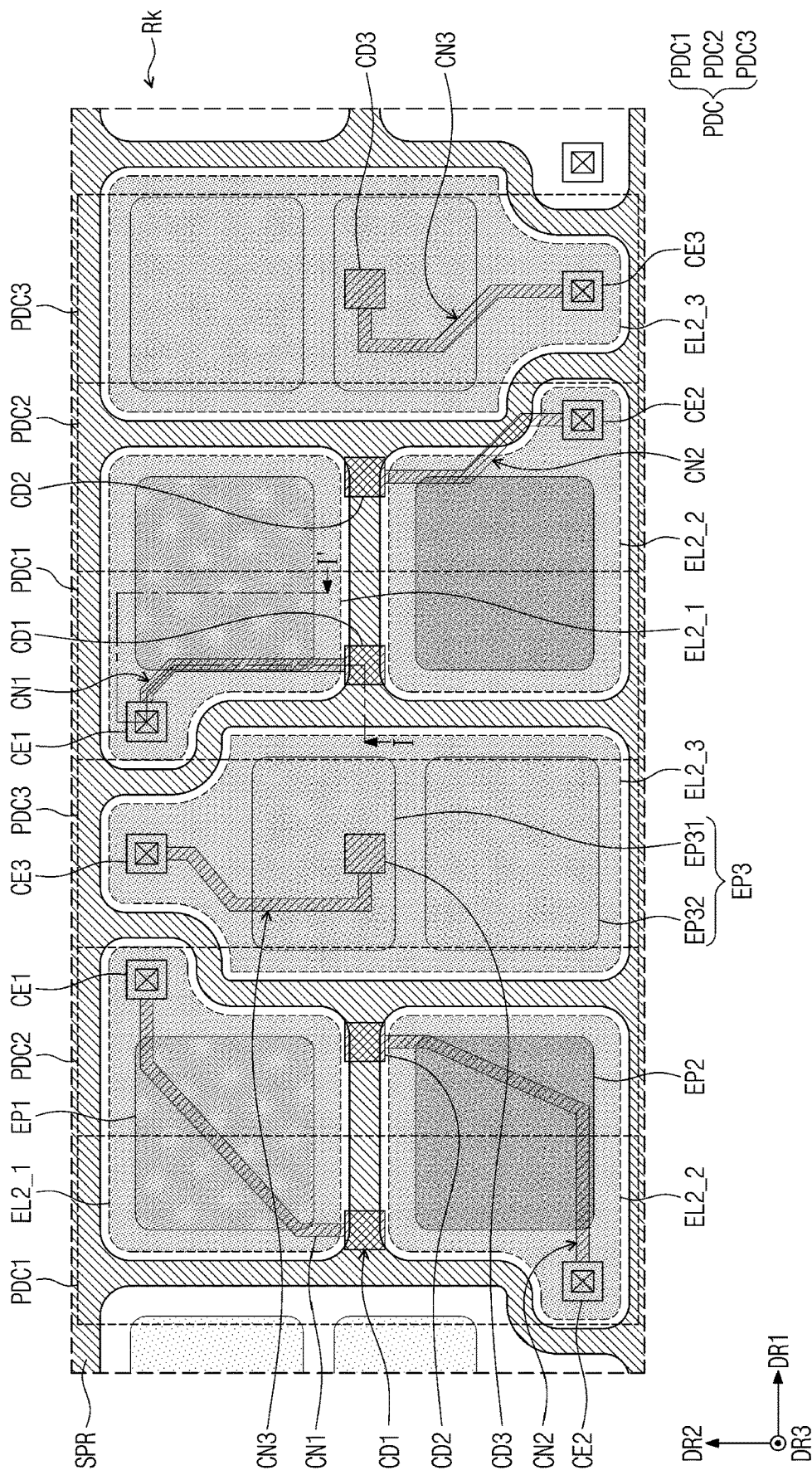
Figure 4C:
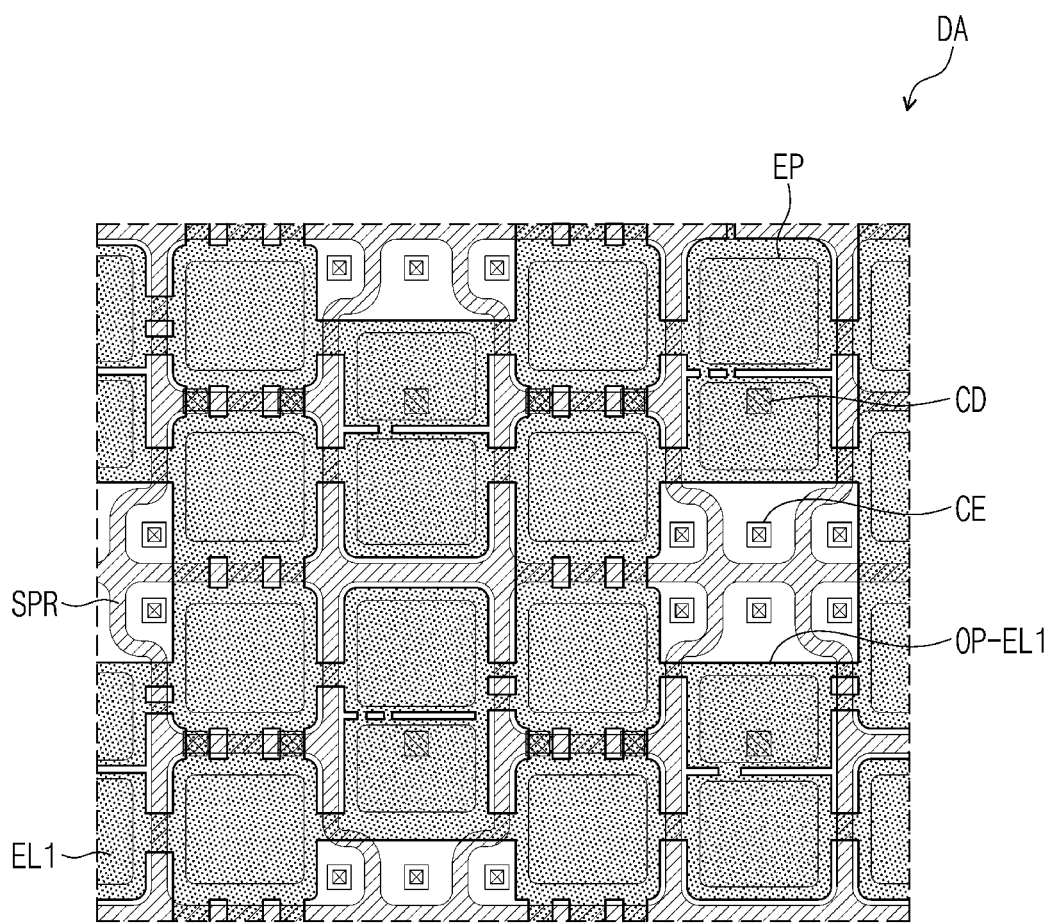

FIGS. 4A to 4C are enlarged schematic plan views of some or a number of areas of the display panel according to an embodiment. FIG. 4A shows an area in which four light emitting units UT are arranged or disposed in two rows by two columns, and FIG. 4B shows the emitting parts arranged or disposed in a first row Rk shown in FIG. 4A. FIG. 4C shows a structure of the display device in which some or a number of components may be omitted and some or a number of components are emphasized. Hereinafter, the disclosure will be described with reference to FIGS. 4A to 4C.

FIG. 4A shows light emitting units UT11, UT12, UT21, and UT22 arranged or disposed in two rows by two columns. The emitting parts arranged or disposed in the first row Rk may include emitting parts constituting the light emitting unit UT11 arranged or disposed in a first row and a first column and the light emitting unit UT12 arranged or disposed in the first row and a second column, and the emitting parts arranged in a second row Rk+1 may include emitting parts constituting the light emitting unit UT21 arranged or disposed in a second row and the first column and the light emitting unit UT22 arranged or disposed in the second row and the second column. FIGS. 4A to 4C show a separator SPR, emitting parts EP1, EP2, and EP3 disposed in areas divided by the separator SPR, connection wirings CN1, CN2, and CN3, a first electrode EL1, and second electrodes EL2_1, EL2_2, and EL2_3 among components of the display panel.

As described above, each of the emitting parts EP1, EP2, and EP3 may correspond to the light emitting opening OP-PDL (refer to FIG. 5) described later. For example, each of the emitting parts EP1, EP2, and EP3 may be an area from which the light is emitted by the light emitting device and may correspond to a unit providing the image displayed through the display panel DP. In more detail, each of the emitting parts EP1, EP2, and EP3 may correspond to an area defined by the light emitting opening OP-PDL, by way of example, an area corresponding to an exposed portion of the first electrode EL of the light emitting device LD.

The emitting parts EP1, EP2, and EP3 may include a first emitting part EP1, a second emitting part EP2, and a third emitting part EP3. The first emitting part EP1, the second emitting part EP2, and the third emitting part EP3 may emit lights having different colors from each other. As an example, the first emitting part EP1 may emit a red light, the second emitting part EP2 may emit a green light, and the third emitting part EP3 may emit a blue light, however, a combination of colors of the first, second, and third emitting parts EP1, EP2, and EP3 should not be limited thereto or thereby. At least two of the emitting parts EP1, EP2, and EP3 may emit the lights having the same color. For instance, all the first, second, and third emitting parts EP1, EP2, and EP3 may emit a blue light or a white light.

Among the emitting parts EP1, EP2, and EP3, the third emitting part EP3 in which the image corresponding to the light emitted by the third light emitting device is displayed may include two sub-emitting parts EP31 and EP32 spaced apart from each other in a second direction DR2, however, this is an example. According to an embodiment, the third emitting part EP3 may be provided in a single pattern having an integral shape like the emitting parts EP1 and EP2, or at least one of the emitting parts EP1 and EP2 may include the sub-emitting parts, and the disclosure should not be particularly limited.

The emitting parts in the first row Rk may include the emitting parts EP1, EP2 and EP3, which are included in the light emitting unit UT11 in the first row and the first column and the light emitting unit UT12 in the first row and the second column, and the emitting parts in the second row Rk+1 may include the emitting parts EP1, EP2 and EP3, which are included in the light emitting unit UT21 in the second row and the first column and the light emitting unit UT22 in the second row and the second column. Some or a number of the emitting parts in the first row Rk and some or a number of the emitting parts in the second row Rk+1 may have a symmetrical shape. For example, the first emitting part EP1 and the second emitting part EP2 of the light emitting unit UT21 in the second row and the first column, and the first emitting part EP1 and the second emitting part EP2 of the light emitting unit UT11 in the first row and the first column, may have a shape and arrangement shape that are axisymmetric with respect to an axis parallel to the second direction DR2. The third emitting part EP3 of the light emitting unit UT21 in the second row and the first column, and the third emitting part EP3 of the light emitting unit UT11 in the first row and the first column, may have a shape and arrangement shape that are axisymmetric with respect to an axis parallel to the first direction DR1. However, this is an example, and an embodiment of the disclosure is not limited thereto.

Hereinafter, the light emitting unit UT11 arranged or disposed in the first row and the first column will be described in detail. For the convenience of explanation, FIG. 4B shows the second electrodes EL2_1, EL2_2, and EL2_3, the pixel drivers PDC, and the connection wirings CN. The second electrodes EL2_1, EL2_2, and EL2_3 may be separated from each other by the separator SPR. In an embodiment, one light emitting unit UT may include three emitting parts EP1, EP2, and EP3. Accordingly, the light emitting unit UT may include three second electrodes EL2_1, EL2_2, and EL2_3 (hereinafter, referred to as first, second, and third cathodes), three pixel drivers PDC1, PDC2, and PDC3, and three connection wirings CN1, CN2, and CN3, however, this is an example. According to an embodiment, the number and arrangement of the light emitting units UT may be designed in various ways and should not be particularly limited.

First, second, and third pixel drivers PDC1, PDC2, and PDC3 may be respectively connected to the light emitting devices forming the first, second, and third emitting parts EP1, EP2, and EP3. In the disclosure, the expression that a component A is connected to a component B may mean not only a case where the component A is directly and physically connected to the component B, but also a case where the component A is electrically connected to the component B.

The first, second, and third pixel drivers PDC1, PDC2, and PDC3 may be sequentially arranged or disposed in the first direction DR1. The arrangement positions of the first, second, and third pixel drivers PDC1, PDC2, and PDC3 may be designed independently from positions and shapes of the first, second, and third emitting parts EP1, EP2, and EP3.

As an example, the first, second, and third pixel drivers PDC1, PDC2, and PDC3 may be placed at positions different from the areas divided by the separator SPR, for example, positions at which the first, second, and third cathodes EL2_1, EL2_2, and EL2_3 are placed or may be designed to have shapes and sizes different from the shapes and sizes of the first, second, and third cathodes EL2_1, EL2_2, and EL2_3. According to an embodiment, the first, second, and third pixel drivers PDC1, PDC2, and PDC3 may be placed to respectively overlap the positions at which the first, second, and third emitting parts EP1, EP2, and EP3 are placed and may be designed to have shapes and sizes similar to those of the areas divided by the separator, for example, shapes and sizes of the first, second, and third cathodes EL2_1, EL2_2, and EL2_3.

In an embodiment, each of the first, second, and third pixel drivers PDC1, PDC2, and PDC3 may have a rectangular shape, each of the first, second, and third emitting parts EP1, EP2, and EP3 may have a size and shape smaller than those of the first, second, and third pixel drivers PDC1, PDC2, and PDC3, and the first, second, and third cathodes EL2_1, EL2_2, and EL2_3 may be placed at positions overlapping the first, second, and third emitting parts EP1, EP2, and EP3 and may have an atypical shape.

Accordingly, as shown in FIG. 4B, the first pixel driver PDC1 may be placed at a position overlapping the first emitting part EP1, the second emitting part EP2, and a portion of another light emitting unit adjacent thereto. The second pixel driver PDC2 may be placed at a position overlapping the first emitting part EP1, the second emitting part EP2, and the third emitting part EP3. The third pixel driver PDC3 may be placed at a position overlapping the third emitting part EP3, however, these are examples. According to an embodiment, the positions of the first, second, and third pixel drivers PDC1, PDC2, and PDC3 may be designed to have various shapes and arrangements independently of the emitting parts EP1, EP2, and EP3 and should not be particularly limited.

The connection wiring CN may be provided in plural, and the connection wirings CN may be arranged or disposed spaced apart from each other. The connection wiring CN may connect the pixel driver and the light emitting device. In detail, the connection wiring CN may correspond to the node (refer to N4 of FIG. 2A or N3 of FIG. 2B) at which the light emitting device LD (refer to FIG. 5) is connected to the pixel driver PDC.

The connection wiring CN may include a first connection part CE (hereinafter, referred to as an emission connection part) and a second connection part CD (hereinafter, referred to as a driver connection part). The emission connection part CE may be provided at one side or a side of the connection wiring CN, and the driver connection part CD may be provided at the other side of the connection wiring CN.

The driver connection part CD may be a portion of the connection wiring CN, which is connected to the pixel driver PDC. In an embodiment, the driver connection part CD may be connected to one electrode of a transistor forming the pixel driver PDC. In detail, the driver connection part CD may be connected to a drain of the sixth transistor T6 shown in FIG. 2A or the drain of the first transistor Ti shown in FIG. 2B. Accordingly, a position of the driver connection part CD may correspond to a position of a transistor (refer to TR of FIG. 5) of the pixel driver, which is physically connected to the connection wiring CN. The emission connection part CE may be a portion of the connection wiring CN, which is connected to the light emitting device. In an embodiment, the emission connection part CE may be connected to a second electrode EL2 (hereinafter, referred to as a cathode, refer to FIG. 5) of the light emitting device.

The light emitting unit UT may include first, second, and third connection wirings CN1, CN2, and CN3. The first connection wiring CN1 may connect the light emitting device, which form the first emitting part EP1, to the first pixel driver PDC1 the second connection wiring CN2 may connect the light emitting device, which form the second emitting part EP2, to the second pixel driver PDC2 and the third connection wiring CN3 may connect the light emitting device, which form the third emitting part EP3, to the third pixel driver PDC3.

In detail, the first, second, and third connection wirings CN1, CN2, and CN3 may connect the first, second, and third cathodes EL2_1, EL2_2, and EL2_3 to the first, second, and third pixel drivers PDC1, PDC2, and PDC3, respectively. The first connection wiring CN1 may include a first driver connection part CD1 connected to the first pixel driver PDC1 and a first emission connection part CE1 connected to the first cathode EL2_1. The second connection wiring CN2 may include a second driver connection part CD2 connected to the second pixel driver PDC2 and a second emission connection part CE2 connected to the second cathode EL2_2. The third connection wiring CN3 may include a third driver connection part CD3 connected to the third pixel driver PDC3 and a third emission connection part CE3 connected to the third cathode EL2_3.

The first, second, and third driver connection parts CD1, CD2, and CD3 may be arranged or disposed in the first direction DR1. As described above, positions of the first, second, and third driver connection parts CD1, CD2, and CD3 may respectively correspond to positions of connection transistors forming the first, second, and third pixel drivers PDC1, PDC2, and PDC3. In one pixel, the connection transistor may include the connection node at which the pixel driver is connected to the light emitting device as its electrode. As an example, the connection transistor may correspond to the sixth transistor T6 of FIG. 2A or the first transistor Ti of FIG. 2B. According to the disclosure, as the pixel driver is designed identically for all pixels regardless of the shape or size of the emitting part and emission colors, a manufacturing process of the display device DD may be simplified, and a manufacturing cost of the display device DD may be reduced.

In an embodiment, the first, second, and third emission connection parts CE1, CE2, and CE3 may be defined at positions that do not overlap the emitting parts EP1, EP2, and EP3 when viewed in the plan view. Each of the emission connection parts CE1, CE2, and CE3 may be provided at the position that does not overlap the light emitting opening OP-PDL (refer to FIG. 5) since the emission connection part CE (refer to FIG. 5) of the connection wiring CN is connected to the light emitting device LD (refer to FIG. 5) and a tip part TP (refer to FIG. 5) is defined in the emission connection part CE (refer to FIG. 5) of the connection wiring CN. For example, the emission connection parts CE1, CE2, and CE3 may be placed at the positions spaced apart from the emitting parts EP1, EP2, and EP3 in the cathodes EL2_1, EL2_2, and EL2_3, and the cathodes EL2_1, EL2_2, and EL2_3 may include some or a number of areas protruded from the emitting parts EP1, EP2, and EP3 when viewed in the plan view to be connected to the connection wirings CN1, CN2, and CN3 at positions where the emission connection parts CE1, CE2, and CE3 are placed.

As an example, the first cathode EL2_1 may include a protruding portion protruded from the first emitting part EP1 at the position that does not overlap the first emitting part EP1 to be connected to the first connection wiring CN1 at the position where the first emission connection part CE1 is placed, and the emission connection part CE1 may be provided in the protruding portion. Accordingly, a first light emitting connection part CE1 can be provided that allows the first cathode EL2_1 to be connected to the first connection wire CN1 without reducing a light emitting area of the first emitting part EP1.

As described above, the connection wiring CN may include the emission connection part CE and the driver connection part CD. In the first pixel driver PDC1, the first driver connection part CD1 connecting to the transistor TR, may be defined at a position that does not overlap the first emitting part EP1 when viewed in the plan view. According to an embodiment, as the first connection wiring CN1 is disposed in the first emitting part EP1, the first cathode EL2_1 may be readily connected to the first pixel driver PDC1.

In the third pixel driver PDC3, the third driver connection part CD3 connecting to the transistor TR may be defined at a position that does not overlap the third emission connection part CE3 when viewed in the plan view and may be place at a position overlapping the third emitting part EP3. According to an embodiment, as the third cathode EL2_3 is connected to the pixel driver PDC3 via the third connection wiring CN3, the third pixel driver PDC3 may be readily connected to the third cathode EL2_3 even though the third driver connection part CD3 overlaps the third emitting part EP3 when viewed in the plan view. Accordingly, restrictions on the design of pixel driver PDC3 due to the position or shape of the third emitting part EP3 may be reduced, and the degree of freedom in circuit design may be improved.

Referring to FIG. 4A again, the emitting parts in the second row Rk+1 may be constituted by emitting parts having a shape and arrangement shape in which the light emitting units UT11 and UT12 in the first row are axisymmetric with respect to the axis parallel to the first direction DR1 or the second direction DR2. Here, due to the characteristics in aspects of the shapes and arrangement of the light emitting units UT11 and UT12 in the first row, the emitting units UT21 and UT22 in the second row may be constituted by emitting parts having a configuration which the light emitting units UT11 and UT12 in the first row are shifted in first direction DR1 or the second direction DR2. For example, the light emitting unit UT21 in the second row and the first column may be constituted by emitting parts having the same shapes as those of the light emitting unit UT12 in the first row and the second column, and the light emitting unit UT22 in the second row and the second column may be constituted by emitting parts having the same shapes as those of the light emitting unit UT11 in the first row and the first column. Accordingly, connection wirings CN-c arranged or disposed in the light emitting unit UT21 arranged or disposed in the second row and the first column may have the same shape and arrangement as those of the connection wirings CN1, CN2, and CN3 arranged or disposed in the light emitting unit UT12 arranged or disposed in the first row and the second column. Similarly, connection wirings CN-d connected to the light emitting unit UT22 arranged or disposed in the second row and the second column may have the same shape and arrangement as those of the connection wirings CN1, CN2, and CN3 connected to the light emitting unit UT11 arranged or disposed in the first row and the first column.

Referring to FIG. 4C, the first electrode EL1 (hereinafter, referred to as an anode) of the light emitting device may be commonly disposed in the emitting parts EP1, EP2, and EP3. For example, the anode EL1 may have an integral shape and may overlap the emitting parts or the separator SPR. As described above, the first driving voltage VDD (refer to FIG. 1) may be applied to the anode EL1, and a common voltage may be applied to all the emitting parts. The anode EL1 may be connected to the first driving voltage line VDL (refer to FIG. 2A) providing the first driving voltage VDD in the peripheral area NDA (refer to FIG. 3A or 3B) or may be connected to the first driving voltage line VDL in the display area DA, and it should not be limited thereto or thereby.

Openings OP-EL1 may be defined through the anode EL1, and the openings OP-EL1 may penetrate through the anode ELL The openings OP-EL1 may be defined not to overlap the emitting parts and may be defined to overlap the separator SPR. The openings OP-EL1 may facilitate a discharge of a gas generated from an organic layer disposed under or below the anode EL1, for example, a sixth insulating layer INS2 (refer to FIG. 5). Accordingly, the gas from the organic layer may be sufficiently discharged in a manufacturing process of the display panel DP, and, deterioration of the light emitting device LD, which is caused by the gas generated from the organic layer, may be prevented.

According to the disclosure, different from the emitting parts in which the cathode overlaps the connection transistor of the pixel driver when viewed in the plan view, the emitting parts including the cathode having the shape that does not overlap the connection transistor of the pixel driver may further include the connection wiring, and thus, the emitting parts may be readily connected to the pixel driver. According to the disclosure, as the emitting parts may further include the connection wiring, the light emitting device may be stably connected to the pixel driver by changing only the shape of the cathode without changing the design of the emitting parts. Accordingly, the influence of the arrangement or shape of the emitting parts on the connection between the emitting parts and the pixel driver may be reduced, a design freedom for the arrangement of the pixel driver may be improved, and deterioration in aperture ratio of the emitting part may be prevented.

Figure 5:
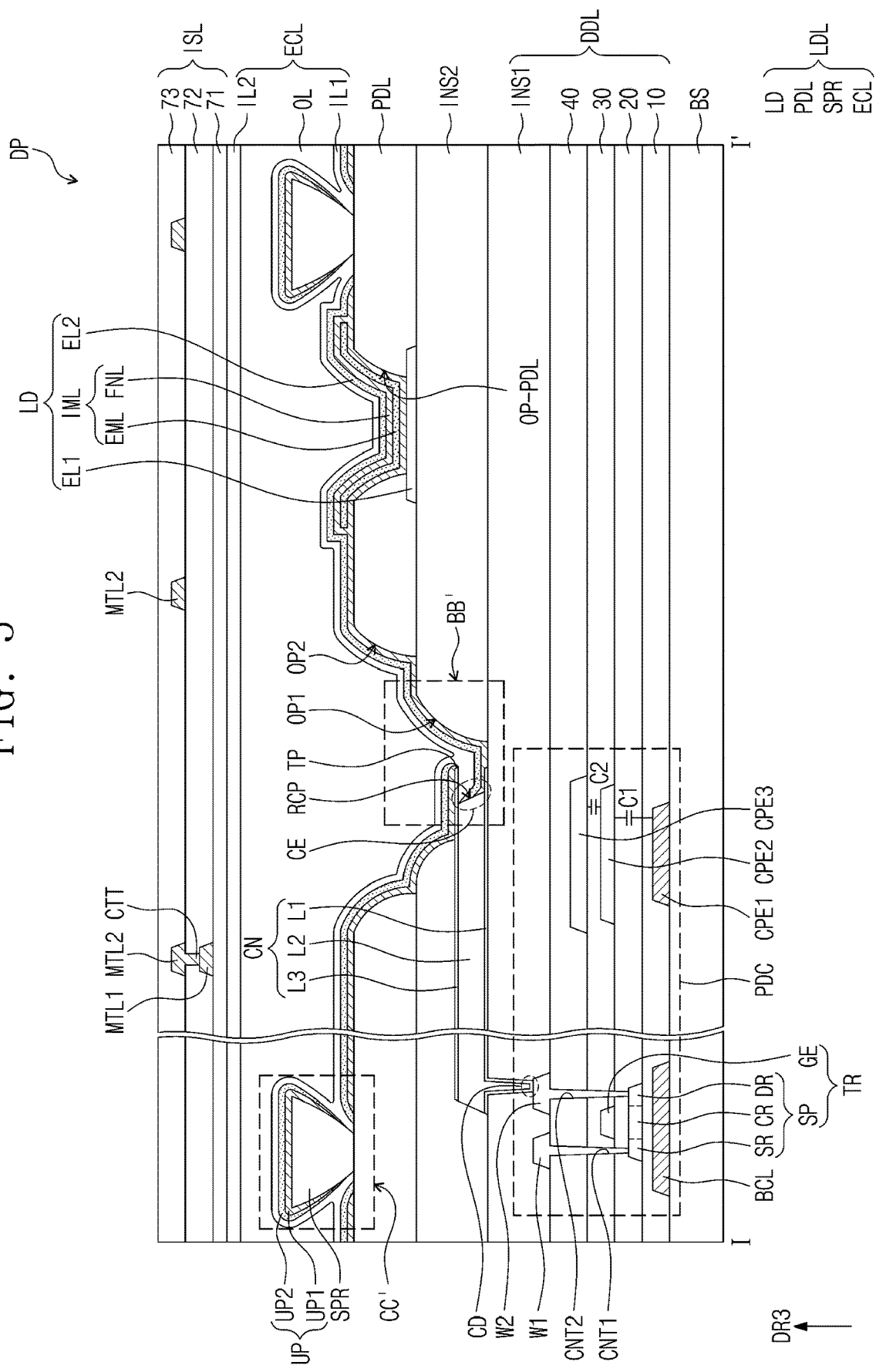
FIG. 5 is a schematic cross-sectional view of a display panel according to an embodiment.
Figure 6A:
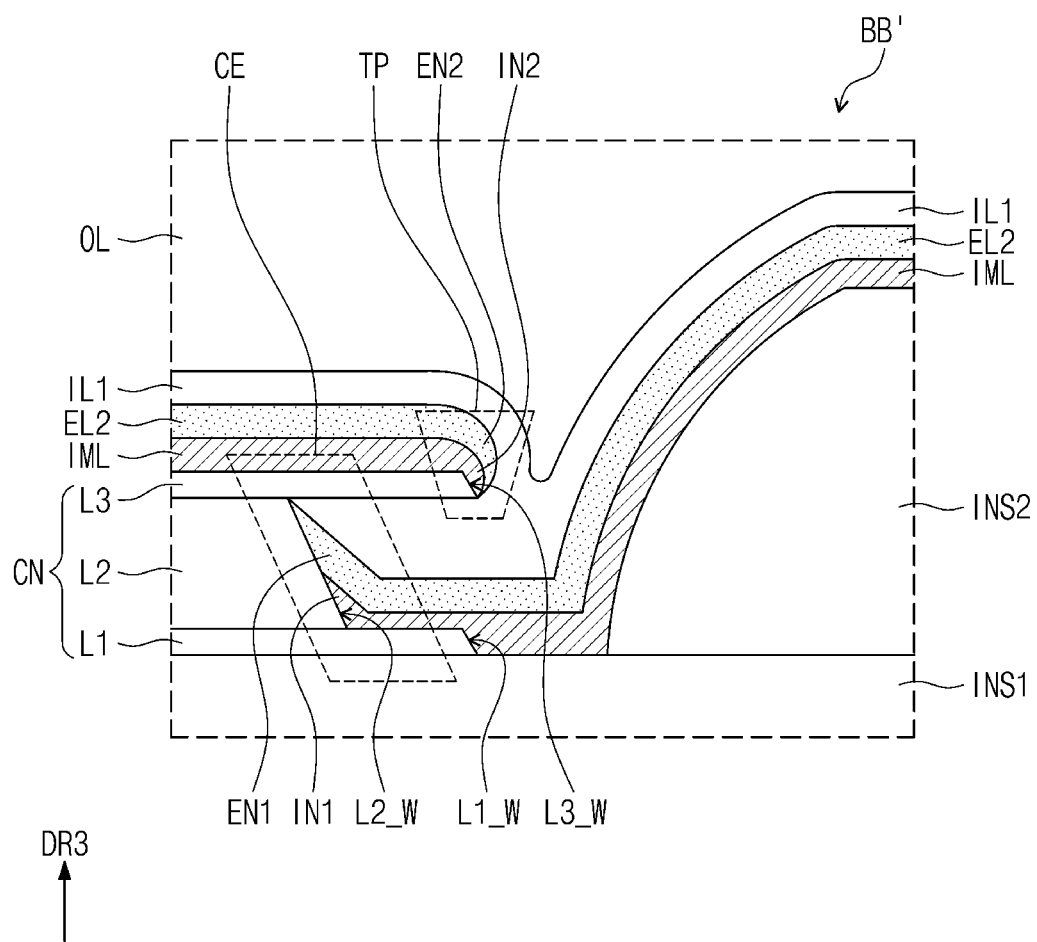
FIGS. 6A and 6B are enlarged schematic cross-sectional views of portions of a display panel according to an embodiment.
Figure 6B:
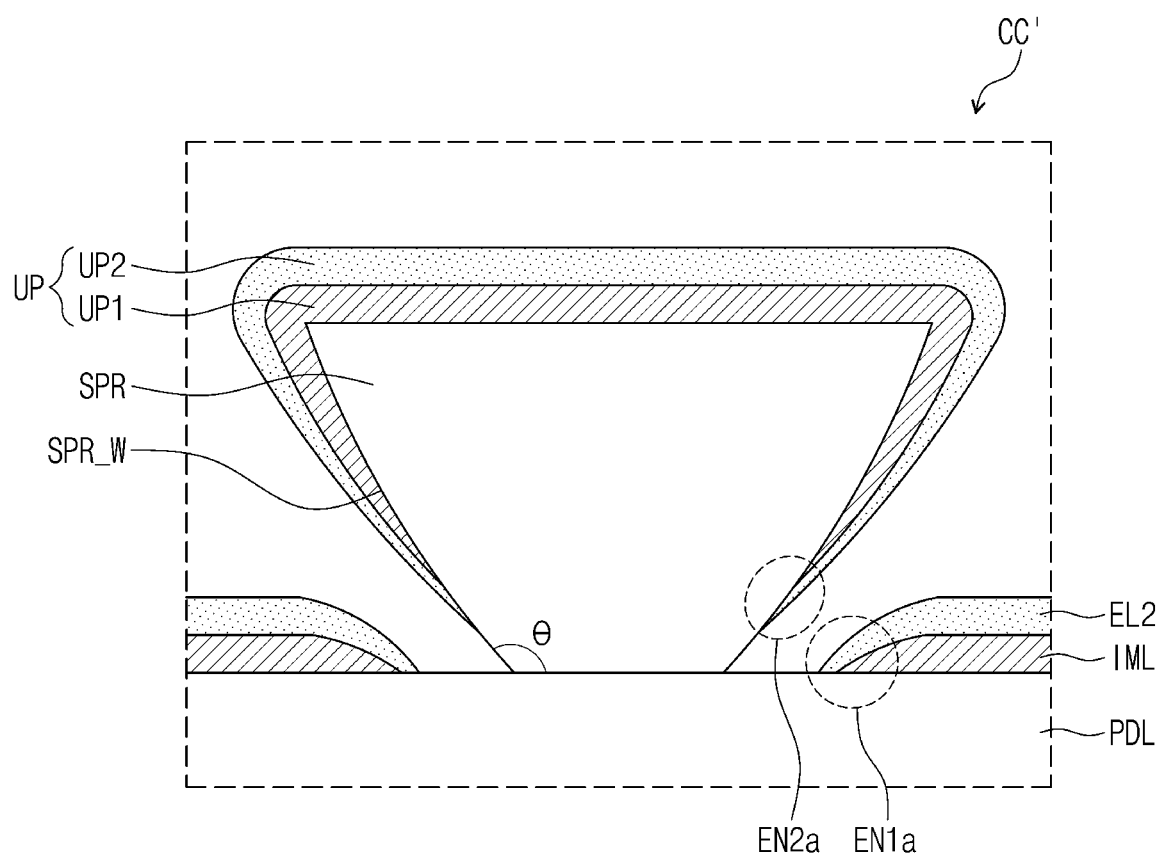

FIG. 5 is a schematic cross-sectional view of the display panel DP according to an embodiment. FIG. 6A is an enlarged schematic cross-sectional view of a portion of the display panel DP according to an embodiment. FIG. 6B is an enlarged schematic cross-sectional view of a portion of the display panel DP according to an embodiment.

FIG. 5 shows a schematic cross-section taken along line I-I' of FIG. 4B. Hereinafter, the disclosure will be described in detail with reference to FIGS. 5 to 6B.

Referring to FIG. 5, the display panel DP may include a base layer BS, a driving device layer DDL, the sixth insulating layer INS2, a light emitting device layer LDL, and a sensor layer ISL. The driving device layer DDL may include insulating layers 10, 20, 30, 40, and INS1 disposed on the base layer BS, conductive patterns and semiconductor patterns, which are disposed between the insulating layers. The conductive patterns and the semiconductor patterns disposed between the insulating layers may form the pixel driver PDC and the connection wiring CN. For the convenience of explanation, FIG. 5 shows a cross-section of a portion of an area in which one emitting part is disposed.

The base layer BS may provide a base surface on which the pixel driver PDC is disposed. The base layer BS may be a rigid substrate or a flexible substrate that is bendable, foldable, or rollable. The base layer BS may be a glass substrate, a metal substrate, or a polymer substrate, however, it should not be limited thereto or thereby. According to an embodiment, the base layer BS may be an inorganic layer, an organic layer, or a composite material layer.

The base layer BS may have a multi-layer structure. For instance, the base layer BS may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon (a-Si) layer. The silicon oxide (SiOx) layer and the amorphous silicon (a-Si) layer may be referred to as a base barrier layer.

Each of the first and second polymer resin layers may include a polyimide-based resin. Each of the first and second polymer resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin", as used herein, refers to the resin that may include a functional group of X.

The display panel DP may include insulating layers, conductive layers, and semiconductor layers, which are disposed on the base layer BS and formed through coating and deposition processes. An organic layer, an inorganic layer, a semiconductor layer, and a conductive layer may be selectively patterned through several photolithography processes, and thus, holes may be defined through the insulating layers or the semiconductor pattern, the conductive pattern, and the signal line may be formed.

The driving device layer DDL may include first, second, third, fourth, and fifth insulating layers 10, 20, 30, 40, and INS1 sequentially stacked each other on the base layer BS and the pixel driver PDC. FIG. 5 shows one transistor TR and two capacitors C1 and C2 of the pixel driver PDC. The transistor TR may correspond to a transistor connected to the light emitting device LD via the connection wiring CN, for example, the connection transistor connected to the node (the fourth node N4 of FIG. 2A or the second node N2 of FIG. 2B) corresponding to the cathode of the light emitting device LD. In detail, the transistor TR may correspond to the sixth transistor T6 of FIG. 2A or the first transistor T1 of FIG. 2B. Although not shown in figures, other transistors forming the pixel driver PDC may have substantially the same structure as that of the transistor TR (hereinafter, referred to as the connection transistor) shown in FIG. 5, however, this is an example. According to an embodiment, other transistors forming the pixel driver PDC may have a structure different from the connection transistor TR and should not be particularly limited.

The first insulating layer 10 may be disposed on the base layer BS. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may have a single-layer structure of a silicon oxide layer. Insulating layers described later may be an inorganic layer and/or an organic layer and may have a single-layer or multi-layer structure. The inorganic layer may include at least one of the above-mentioned materials, however, it should not be limited thereto or thereby.

The first insulating layer 10 may cover a bottom conductive layer BCL. For example, the display panel may further include the bottom conductive layer BCL disposed under or below the connection transistor TR and overlapping the connection transistor TR. The bottom conductive layer BCL may prevent an electric potential caused by a polarization phenomenon of the base layer BS from exerting influence on the connection transistor TR. The bottom conductive layer BCL may block a light incident into the connection transistor TR from a lower side of the conductive layer BCL. At least one of an inorganic barrier layer and a buffer layer may be further disposed between the bottom conductive layer BCL and the base layer BS.

The bottom conductive layer BCL may include a reflective metal material. As an example, the bottom conductive layer BCL may include titanium (Ti), molybdenum (Mo), an alloy including molybdenum (Mo), aluminum (Al), an alloy including aluminum (Al), aluminum nitride (AlN), tungsten (W), tungsten nitride (WN), and copper (Cu).

In an embodiment, the bottom conductive layer BCL may be connected to a source of the transistor TR via a source electrode pattern W1. The bottom conductive layer BCL may be synchronized with the source of the transistor TR, however, this is an example. According to an embodiment, the bottom conductive layer BCL may be connected to and synchronized with a gate of the transistor TR. According to an embodiment, the bottom conductive layer BCL may be connected to another electrode to independently receive a constant voltage or a pulse signal. According to an embodiment, the bottom conductive layer BCL may be provided in an isolated form isolated from other conductive patterns. The source electrode pattern W1 may be omitted. The bottom conductive layer BCL may be provided in a variety of shapes and should not be particularly limited.

The connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. As an example, the oxide semiconductor may include a transparent conductive oxide (TCO), such as indium tin oxide (ITO), indium zinc oxide (IZO), indium gallium zinc oxide (IGZO), zinc oxide (ZnO), indium oxide (In$_2$O$_3$), or the like, however, the material for the semiconductor pattern SP should not be limited thereto or thereby. As an example, the semiconductor pattern may include amorphous silicon, low temperature polycrystalline silicon, or polycrystalline silicon.

The second insulating layer 20 may commonly overlap the pixels and may cover the semiconductor pattern SP. The second insulating layer 20 may be an inorganic layer and/or an organic layer and may have a single-layer or multi-layer structure. The second insulating layer 20 may include at least one of aluminum oxide, titanium oxide, silicon oxide, silicon nitride, silicon oxynitride, zirconium oxide, and hafnium oxide. In an embodiment, the second insulating layer 20 may have a single-layer structure of a silicon oxide layer.

The semiconductor pattern SP may include a source area SR, a drain area DR, and an active area CR (or a channel area) distinguished from each other depending on a degree of conductivity. The channel area CR may overlap the gate electrode GE when viewed in the plan view. The source area SR and the drain area DR may be spaced apart from each other with the channel area CR interposed therebetween. In case that the semiconductor pattern SP is the oxide semiconductor, each of the source area SR and the drain area DR may be a reduced area. Accordingly, the source area SR and the drain area DR may have a relatively high content of reduced metal compared with the active area CR. According to an embodiment, in case that the semiconductor pattern SP is the polycrystalline silicon, each of the source area SR and the drain area DR may be a highly doped area.

The source area SR and the drain area DR may have a relatively high conductivity compared with the channel area CR. The source area SR may correspond to a source electrode of the connection transistor TR, and the drain area DR may correspond to a drain electrode of the connection transistor TR. As shown in FIG. 5, the connection transistor TR may further include separate source and drain electrode patterns respectively connected to the source area SR and the drain area DR. In detail, each of the separate source and drain electrode patterns may be integral with one of lines forming the pixel driver PDC, however, it should not be limited thereto or thereby.

The gate electrode GE may be disposed on the second insulating layer 20. The gate electrode GE may correspond to the gate of the connection transistor TR.

The gate electrode GE may be disposed on the semiconductor pattern SP, however, this is an example. According to an embodiment, the gate electrode GE may be disposed under or below the semiconductor pattern SP, and it should not be particularly limited.

The gate electrode GE may include titanium (Ti), silver (Ag), molybdenum (Mo), aluminum (Al), aluminum nitride (AlN), tungsten (W), tungsten nitride (WN), copper (Cu), or an alloy thereof, however, it should not be particularly limited.

Among conductive patterns W1, W2, CPE1, CPE2, and CPE3, a first capacitor electrode CPE1 and a second capacitor electrode CPE2 may form the first capacitor C1. The first capacitor electrode CPE1 and the second capacitor electrode CPE2 may be spaced apart from each other with the first insulating layer 10 and the second insulating layer 20 interposed therebetween.

According to an embodiment, the first capacitor electrode CPE1 and the bottom conductive layer BCL may be integral with each other. The second capacitor electrode CPE2 may be integral with the gate electrode GE.

A third capacitor electrode CPE3 may be disposed on the third insulating layer 30. The third capacitor electrode CPE3 may be spaced apart from the second capacitor electrode CPE2 with the third insulating layer 30 interposed therebetween and may overlap the second capacitor electrode CPE2. The third capacitor electrode CPE3 and the second capacitor electrode CPE2 may form the second capacitor C2.

The fourth insulating layer 40 may be disposed on the third capacitor electrode CPE3.

The source electrode pattern W1 and the drain electrode pattern W2 may be disposed on the fourth insulating layer 40. The source electrode pattern W1 may be connected to the source area SR of the connection transistor TR via a first contact hole CNT1, and the source electrode pattern W1 and the source area SR of the semiconductor pattern SP may serve as the source of the connection transistor TR. The drain electrode pattern W2 may be connected to the drain area DR of the connection transistor TR via a second contact hole CNT2, and the drain electrode pattern W2 and the drain area DR of the semiconductor pattern SP may serve as the drain of the connection transistor TR.

The fifth insulating layer INS1 may be disposed on the source electrode pattern W1 and the drain electrode pattern W2. The fifth insulating layer INS1 may be referred to as a lower insulating layer INS1.

The connection wiring CN may be disposed on the fifth insulating layer INS1. The connection wiring CN may connect the connection transistor TR to the light emitting device LD. The connection wiring CN may be a connection node that connects the pixel driver PDC to the light emitting device LD. For example, the connection wiring CN may correspond to the fourth node N4 shown in FIG. 2A or may correspond to the second node N2 shown in FIG. 2B, however, this is an example. According to an embodiment, the connection wiring CN may be defined as a connection node connected to various components of the pixel driver PDC according to the design of the pixel driver PDC as long as the connection wiring CN is connected to the light emitting device LD, however, it should not be particularly limited.

The sixth insulating layer INS2 may be disposed between the driving device layer DDL and the light emitting device layer LDL. The sixth insulating layer INS2 may be disposed on the fifth insulating layer INS1 and may cover the connection wiring CN. Each of the fifth insulating layer INS1 and the sixth insulating layer INS2 may be an organic layer. As an example, each of the fifth insulating layer INS1 and the sixth insulating layer INS2 may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, and a fluorine-based polymer, a p-xylene-based polymer, a vinyl alcohol-based polymer, or blends thereof. The sixth insulating layer INS2 may be referred to as an upper insulating layer INS2.

The sixth insulating layer INS2 may be provided with a through hole defined therethrough to expose at least a portion of the connection wiring CN. The connection wiring CN may be connected to the light emitting device LD of the light emitting device layer LDL via the portion exposed without being covered by the sixth insulating layer INS2. For example, the connection wiring CN may connect the connection transistor TR to the light emitting device LD. This will be described in detail later.

The light emitting device layer LDL may be disposed on the sixth insulating layer INS2. The light emitting device layer LDL may include a pixel definition layer PDL, the light emitting device LD, an encapsulation layer ECL, and the separator SPR. According to an embodiment, the sixth insulating layer INS2 may be omitted from the display panel DP or may be provided in plural, and it should not be particularly limited.

The pixel definition layer PDL may be an organic layer. As an example, the pixel definition layer PDL may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, and a fluorine-based polymer, a p-xylene-based polymer, a vinyl alcohol-based polymer, or blends thereof.

The pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may be provided with an opening OP-PDL (hereinafter, referred to as a light emitting opening) defined therethrough. The light emitting opening OP-PDL may be provided in plural, and the light emitting openings OP-PDL may respectively correspond to the light emitting devices LD. All components of the light emitting device LD may overlap each other in the light emitting opening OP-PDL, and the light emitting opening OP-PDL may correspond to an area where the light emitted from the light emitting device LD is substantially displayed. Accordingly, the shape of the emitting part EP (refer to FIG. 3A) may substantially correspond to the shape of the light emitting opening OP-PDL when viewed in the plan view.

The light emitting device LD may include an organic light emitting material, an inorganic light emitting material, an organic-inorganic light emitting material, a quantum dot, a quantum rod, a micro-LED, or a nano-LED.

The light emitting device LD may include a first electrode EL1, an intermediate layer IML, and a second electrode EL2. The first electrode EL1 may be a semi-transmissive electrode, a transmissive electrode, or a reflective electrode. According to an embodiment, the first electrode EL1 may include a reflective layer formed of silver (Ag), magnesium (Mg), aluminum (Al), platinum (Pt), palladium (Pd), gold (Au), nickel (N1), neodymium (Nd), iridium (Jr), chromium (Cr), or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For instance, the first electrode AE may have a stack structure of ITO/Ag/ITO.

In an embodiment, the first electrode EL1 may be the anode of the light emitting device LD. For example, the first electrode EL1 may be connected to the first power line VDL (refer to FIG. 2A) and may receive the first power supply voltage VDD (refer to FIG. 2A). The first electrode EL1 may be connected to the first power line VDL in the display area DA or may be connected to the first power line VDL in the peripheral area NDA. In the case where the first electrode EL1 is connected to the first power line VDL in the peripheral area NDA, the first power line VDL may be disposed in the peripheral area NDA, and the first electrode EL1 may extend to the peripheral area NDA.

In an embodiment, the first electrode EL1 overlaps the light emitting opening OP-PDL and does not overlap the separator SPR, however, it should not be limited thereto or thereby. As described above, the first electrodes of each pixel may have an integral shape and may have a mesh or lattice shape in which openings are defined in some or a number of areas as shown in FIG. 4C. For example, the first electrode EL1 may have a variety of shapes as long as the light emitting devices receive the same first power supply voltage VDD through their first electrodes EL1, however, it should not be limited thereto or thereby.

The intermediate layer IML may be disposed between the first electrode EL1 and the second electrode EL2. The intermediate layer IML may include an emitting layer EML and a functional layer FNL, however, this is an example. According to an embodiment, the light emitting device LD may include the intermediate layer IML with various structures and should not be particularly limited. As an example, the functional layer FNL may include layers or may include two or more layers spaced apart from each other with the emitting layer EML interposed therebetween. According to an embodiment, the functional layer FNL may be omitted.

The emitting layer EML may absorb an energy corresponding to a difference in electric potential between the first electrode EL1 and the second electrode EL2 and may emit the light. The emitting layer EML may include an organic light emitting material, however, it should not be limited thereto or thereby. According to an embodiment, the emitting layer EML may include an inorganic light emitting material or may include a layer obtained by mixing the organic light emitting material with the inorganic light emitting material.

The emitting layer EML may be disposed to overlap the light emitting opening OP-PDL. In an embodiment, the emitting layer EML may be formed separately in each of the pixels. In the case where the emitting layer EML is formed separately in each of the emitting parts EP, the emitting layer EML may emit the light having at least one of blue, red, and green colors, however, it should not be limited thereto or thereby. According to an embodiment, the emitting layer EML may have an integral shape to be commonly disposed in the emitting parts EP adjacent to each other. The emitting layer EML may provide a blue light or a white light. In FIG. 5, the emitting layer EML and the functional layer FNL are illustrated in different shapes, however they should not be limited thereto. The emitting layer EML may have substantially the same shape as that of the functional layer FNL on a plane.

The functional layer FNL may be disposed between the first electrode EL1 and the second electrode EL2. In detail, the functional layer FNL may be disposed between the first electrode EL1 and the emitting layer EML or may be disposed between the second electrode EL2 and the emitting layer EML. According to an embodiment, the functional layer FNL may be disposed between the first electrode EL1 and the emitting layer EML and between the second electrode EL2 and the emitting layer EML. In an embodiment, the emitting layer EML may be inserted into the functional layer FNL, however, this is an example. According to an embodiment, the functional layer FNL may include a layer disposed between the emitting layer EML and the first electrode EL1 and/or a layer disposed between the emitting layer EML and the second electrode EL2, and each of the layers may be provided in plural. However, they should not be limited thereto or thereby.

The functional layer FNL may control a movement of electric charges. The functional layer FNL may include a hole injection/transport material and/or an electron injection/transport material. The functional layer FNL may include at least one of an electron block layer, a hole transport layer, a hole injection layer, a hole block layer, an electron transport layer, an electron injection layer, and an electric charge generating layer.

The second electrode EL2 may be one of the second electrodes EL2_1, EL2_2, and EL2_3 shown in FIGS. 4A to 4C. As an example, the second electrode EL2 may be the second electrode EL2_1 (refer to FIG. 4B). The second electrode EL2 may be disposed on the intermediate layer IML. As described above, the second electrode EL2 may be connected to the pixel driver PDC via the third node (refer to N3 of FIG. 2A or N3 of FIG. 2B). In an embodiment, the second electrode EL2 may be electrically connected to the connection transistor TR via the connection wiring CN.

As described above, the connection wiring CN may include the driver connection part CD and the emission connection part CE. FIGS. 6A and 6B are enlarged views of an area BB' and an area CC' of FIG. 5. Hereinafter, the connection wiring CN will be described with reference to FIGS. 5 to 6B.

The driver connection part CD of the connection wiring CN may be connected to the pixel driver PDC and may be substantially connected to the connection transistor TR. In an embodiment, the driver connection part CD may be connected to the drain area DR of the semiconductor pattern SP via the drain electrode pattern W2 of the transistor TR after penetrating through the fifth insulating layer INS1.

The emission connection part CE of the connection wiring CN may be connected to the light emitting device LD. In the emission connection part CE, a connection portion RCP may indicate a portion where the light emitting device LD is in contact with the connection wiring CN. The connection portion RCP may correspond to an end of the connection wiring CN. The emission connection part CE may be defined in an area exposed without being covered by the sixth insulating layer INS2, and the second electrode EL2 may be directly in contact with the emission connection part CE. The tip part TP may be defined in the connection wiring CN adjacent emission connection part CE.

Referring to FIGS. 5 and 6A, the connection wiring CN may have a three-layer structure. In detail, the connection wiring CN may include a first layer L1, a second layer L2, and a third layer L3, which are sequentially stacked each other in a third direction DR3. The first layer L1 may have a relatively thinner thickness than that of the second layer L2. As an example, the first layer L1 may include titanium (Ti).

The second layer L2 may include a material different from that of the first layer L1. The second layer L2 may include a material with high conductivity. As an example, the second layer L2 may include aluminum (Al).

The second layer L2 may include a material having an etch selectivity with respect to the first layer L1. A side surface L2_W of the second layer L2 may be defined inside a side surface L1_W of the first layer L1. For example, the side surface L1_W of the first layer L1 may protrude outward from the side surface L2_W of the second layer L2.

The third layer L3 may include a material different from that of the second layer L2. The third layer L3 may include a material having no etch selectivity with respect to the second layer L2. As an example, the third layer L3 may include titanium (Ti). A side surface L3_W of the third layer L3 may protrude outward from the side surface L2_W of the second layer L2. For example, the side surface L2_W of the second layer L2 may be disposed inside the side surface L3_W of the third layer L3 and may have an undercut shape or an overhang structure. The tip part TP of the connection wiring CN adjacent may be defined by a portion of the third layer L3, which is more protruded than the second layer L2.

The tip part TP may be exposed without being covered by the sixth insulating layer INS2 and the pixel definition layer PDL. In detail, a first opening OP1 may be defined through the sixth insulating layer INS2, and a second opening OP2 may be defined through the pixel definition layer PDL to overlap the first opening OP1, and thus, one side or side of the connection wiring CN where the tip part TP is defined may be exposed. The second opening OP2 may have a size equal to or greater than the first opening OP1 when viewed in the plan view.

The second electrode EL2 may also be disposed on a portion of the sixth insulating layer INS2 exposed through the second opening OP2. The second electrode EL2 may also be disposed on an upper surface of the sixth insulating layer INS2 and an upper surface of the tip part TP of the connection wiring CN, which is exposed through the first opening OP1. The second electrode EL2 may include one end or an end EN1 formed along the upper surface of the sixth insulating layer INS2 and the other end EN2 formed at an upper side of the tip part TP. The one end or an end EN1 and the other end EN2 may be separated from each other in the area where the emission connection part CE is defined. For example, the second electrode EL2 may be disconnected by the tip part TP, and thus, the one end or an end EN1 and the other end EN2 separated from the one end or an end EN1 may be formed. The one end or an end EN1 may be formed along a side surface of the second layer L2, may be in contact with the side surface L2_W of the second layer L2, and may be disposed under or below the third layer L3. The other end EN2 may be disconnected at an end of the third layer L3 and may not extend to a lower portion of the third layer L3. In an embodiment, the other end EN2 may cover the side surface L3_W of the third layer L3, however, this is an example, and at least a portion of the side surface L3_W of the third layer L3 may be exposed without being covered by the other end EN2. According to the disclosure, the tip part TP formed at the connection wiring CN may divide the second electrode EL2 into two portions. One of the two portions may be in contact with the second layer L2 having relatively high conductivity and thus may be electrically connected to emission connection part CE of the connection wiring CN.

The intermediate layer IML may be disconnected into two portions IN1 and IN2 by the tip part TP. The intermediate layer IML may include one end or an end IN1 formed along the upper surface of the sixth insulating layer INS2 and the other end IN2 formed on the upper surface of the tip part TP. The one end or an end IN1 and the other end IN2 of the intermediate layer IML may be separated from each other in the area where the emission connection part CE is defined.

The one end or an end IN1 of the two ends IN1 and IN2 of the intermediate layer IML, which is disposed adjacent to the one end or an end EN1 of the second electrode EL2, may cover the first layer L1 and may be in contact with the second layer L2, and the other end IN2 disposed adjacent to the other end EN2 of the second electrode EL2 may be formed on the other end EN2 of the second electrode EL2. The one end or an end EN1 of the second electrode EL2 may have a relatively larger contact area with respect to the side surface L2_W of the second layer L2 compared with the one end or an end IN1 of the intermediate layer IML disposed at the same side as the one end or an end EN1 of the second electrode EL2. The portion of the side surface L2_W of the second layer L2, which is not covered by the intermediate layer IML, may be entirely covered by the second electrode EL2. Accordingly, due to a difference in deposition angle described later, a contact area between the intermediate layer IML and the side surface L2_W of the second layer L2 may be reduced while the intermediate layer IML is separated into two portions by the tip part TP and a contact area between the second electrode EL2 and the side surface L2_W of the second layer L2 may increase. Therefore, in the emission connection part CE, an intervening degree of the intermediate layer IML may be reduced, and the second electrode EL2 and the second layer L2 may be readily connected to each other. As a result, the second electrode EL2 may be divided into the portions for each pixel without performing a separate patterning process and may be stably connected to the connection wiring CN.

The display panel DP may include the separator SPR. The separator SPR may be disposed on the pixel definition layer PDL. The second electrode EL2 and the intermediate layer IML may be commonly formed in the pixels using an open mask. The second electrode EL2 and the intermediate layer IML may be divided into portions by the separator SPR. As described above, the separator SPR may have a closed line form for each emitting part so that each emitting part is independent, and thus, the second electrode EL2 may be divided into plural portions to be respectively disposed in each of the emitting parts. For example, the second electrode EL2 may be disposed in each pixel and may be electrically isolated from another second electrode EL2 disposed in another pixel adjacent thereto.

The separator SPR will be described in detail with reference to FIGS. 5 and 6B. FIG. 6B is an enlarged schematic cross-sectional view of the separator SPR. The separator SPR may have a reverse-tapered shape. For example, an internal angle θ (hereinafter, referred to as a taper angle) between an upper surface of the pixel definition layer PDL and an outer surface SPR_W of the separator SPR may be an obtuse angle, however, this is an example. According to an embodiment, the taper angle θ of the separator SPR may be set in various ways as long as the a deposition layer, such as the intermediate layer IML or the second electrode EL2, is disconnected, and the separator SPR may have the same structure as the tip part TP, and the disclosure should not be particularly limited.

The separator SPR may include an organic material and may have an insulating property. The deposition layer, for example, the intermediate layer IML and the second electrode EL2, may be disconnected by the separator SPR. The intermediate layer IML and the second electrode EL2 may be respectively separated from the intermediate layer IML and the second electrode EL2, which are included in the light emitting device adjacent thereto, by the separator SPR. A first end EN1a and a second end EN2a may be formed in the deposition layer by the separator SPR. The first end EN1a may be spaced apart from the separator SPR and may be disposed on the pixel definition layer PDL. The second end EN2a may be separated from the first end EN1a and may cover at least a portion of the outer surface SPR_W of the separator SPR. FIG. 6B shows a structure in which the first end EN1a is spaced apart from the outer surface SPR_W of the separator SPR by a distance (e.g., a predetermined or selectable distance), however, the disclosure should not be limited thereto or thereby. According to an embodiment, the first end EN1a may be in contact with the outer surface SPR_W of the separator SPR as long as the first end EN1a is separated from the second end EN2a.

The expression "A first end EN1a and a second end EN2a may be formed in the deposition layer" may mean that the deposition layer is electrically disconnected. For example, although the first end EN1a and the second end EN2a of the deposition layer are not formed and the deposition layer is not physically disconnected, the deposition layer may be determined as being divided by the separator SPR in case that a thickness of the second end EN2a formed along the outer surface SPR_W of the separator SPR is thin and thus a portion of the deposition layer formed in the separator SPR is not electrically connected to another portion of the deposition layer adjacent to the portion formed in the separator SPR.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 may be formed through the same process as the intermediate layer IML, and the second dummy layer UP2 may be formed through the same process as the second electrode EL2. For example, the first dummy layer UP1 and the second dummy layer UP2 may be formed during the manufacturing process of the intermediate layer IML and the second electrode EL2. According to an embodiment, the dummy layer UP may be omitted.

According to the disclosure, as the second electrode EL2 or the intermediate layer IML is not formed or is formed thinly on the outer surface SPR_W of the separator SPR in case that the second electrode EL2 and the intermediate layer IML are formed, the second electrode EL2 and the intermediate layer IML may be readily divided for each pixel even though a separate patterning process using a mask is not performed. However, this is an example, and according to an embodiment, the shape of the separator SPR may be changed in various ways as long as the second electrode EL2 and the intermediate layer IML are disconnected and should not be particularly limited.

According to the disclosure, as the display panel DP may include the connection wiring CN, the second electrode EL2 may be readily electrically connected to the connection transistor TR. According to the disclosure, as the tip part TP is formed in the connection wiring CN, the second electrode EL2 may be readily partitioned for each emitting part without a separate patterning process. Further, the electrical connection between the second electrode EL2 and the connection wiring CN may be stably implemented by adjusting the deposition angle. Accordingly, even though the second electrode EL2 connected to the pixel driver PDC is positioned at an upper side of the first electrode EL1, the display panel DP in which the second electrode EL2 is stably connected to the pixel driver PDC may be readily implemented.

Referring to FIG. 5 again, the encapsulation layer ECL may be disposed on the pixel definition layer PDL and may cover the separator SPR. The encapsulation layer ECL may include a first inorganic layer IL1, an organic layer OL, and a second inorganic layer IL2, which may be sequentially stacked each other, however, it should not be limited thereto or thereby. According to an embodiment, the encapsulation layer ECL may further include inorganic layers and organic layers.

The first and second inorganic layers IL1 and IL2 may protect the light emitting device layer LDL from moisture and oxygen, and the organic layer OL may protect the light emitting device layer LDL from a foreign substance such as dust particles. The first and second inorganic layers IL1 and IL2 may include a silicon nitride layer, a silicon oxynitride layer, a silicon oxide layer, a titanium oxide layer, or an aluminum oxide layer. The organic layer OL may include an acrylic-based organic layer, however, it should not be particularly limited.

A sensing layer ISL may sense external inputs. The sensing layer ISL may be formed on the light emitting device layer LDL through successive processes. The sensing layer ISL may be disposed directly on the light emitting device layer LDL. In the disclosure, the expression "the sensing layer ISL is disposed directly on the light emitting device layer LDL" means that no intervening elements are present between the sensing layer ISL and the light emitting device layer LDL. For example, a separate adhesive member may not be disposed between the sensing layer ISL and the light emitting device layer LDL, however, this is an example. According to an embodiment, the sensing layer ISL may be provided after being separately formed and may be coupled or connected to the light emitting device layer LDL by an adhesive member, but it should not be limited thereto or thereby.

The sensing layer ISL may include conductive layers MTL1 and MTL2 and insulating layers 71, 72, and 73. The insulating layers 71, 72, and 73 may include first, second, and third sensing insulating layers 71, 72, and 73. However, this is an example, and the number of insulating layers should not be particularly limited.

The first sensing insulating layer 71 may be an inorganic layer including at least one of silicon nitride, silicon oxynitride, and silicon oxide. According to an embodiment, the first sensing insulating layer 71 may be an organic layer including an epoxy resin, an acrylic resin, or an imide-based resin. The first sensing insulating layer 71 may have a single-layer structure or a multi-layer structure of layers stacked each other in the third direction DR3.

The conductive layers MTL1 and MTL2 may include a first conductive layer MTL1 and a second conductive layer MTL2. The first conductive layer MTL1 may be disposed between the first sensing insulating layer 71 and the second sensing insulating layer 72, and the second conductive layer MTL2 may be disposed between the second sensing insulating layer 72 and the third sensing insulating layer 73. A portion of the second conductive layer MTL2 may be connected to the first conductive layer MTL1 via a contact hole CTT formed through the second sensing insulating layer 72. Each of the conductive layers MTL1 and MTL2 may have a single-layer structure or a multi-layer structure of layers stacked each other in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (IZTO), or the like within the spirit and the scope of the disclosure. The transparent conductive layer may include conductive polymer such as PEDOT, metal nanowire, graphene, or the like within the spirit and the scope of the disclosure.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The first conductive layer MTL1 and the second conductive layer MTL2 may form a sensor to sense the external inputs in the sensing layer ISL. The sensor may be driven in a capacitive method, for example, a mutual capacitive method or a self-capacitive method, however, this is an example. According to an embodiment, the sensor may be driven in a resistive film method, an ultrasonic method, or an infrared method rather than the capacitive method, and it should not be particularly limited.

Each of the first conductive layer MTL1 and the second conductive layer MTL2 may include a transparent conductive oxide or may have a metal mesh shape formed of an opaque conductive material. The first conductive layer MTL1 and the second conductive layer MTL2 may include various materials and various shapes as long as a visibility of the image displayed by the light generated by the display element layer DP-OLED is not deteriorated.

The third sensing insulating layer 73 may include an inorganic layer. The inorganic layer may include at least one of aluminum oxide, titanium oxide, silicon oxide, silicon nitride, silicon oxynitride, zirconium oxide, and hafnium oxide.

According to an embodiment, the third sensing insulating layer 73 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

According to the disclosure, the display panel DP may include the emission connection part CE and the driver connection part CD spaced apart from the emission connection part CE, and thus, the light emitting device LD may be designed to be provided at various positions without being limited to the configuration of the pixel driver PDC or the position of the connection transistor TR. For example, the degree of freedom in designing the position of the light emitting device LD or in designing the pixel driver PDC may increase. According to the disclosure, as the display panel DP may include the connection wiring CN, the second electrode EL2 positioned at the upper side of the first electrode EL1 serving as the anode may be readily connected to the pixel driver PDC. Further, according to the disclosure, since the tip part is formed at the connection wiring CN, the organic layer such as the intermediate layer IML may be readily disconnected without the separate patterning process. The second electrode EL2 may be readily electrically connected to the connection wiring CN by adjusting the deposition angle.

Figure 7:
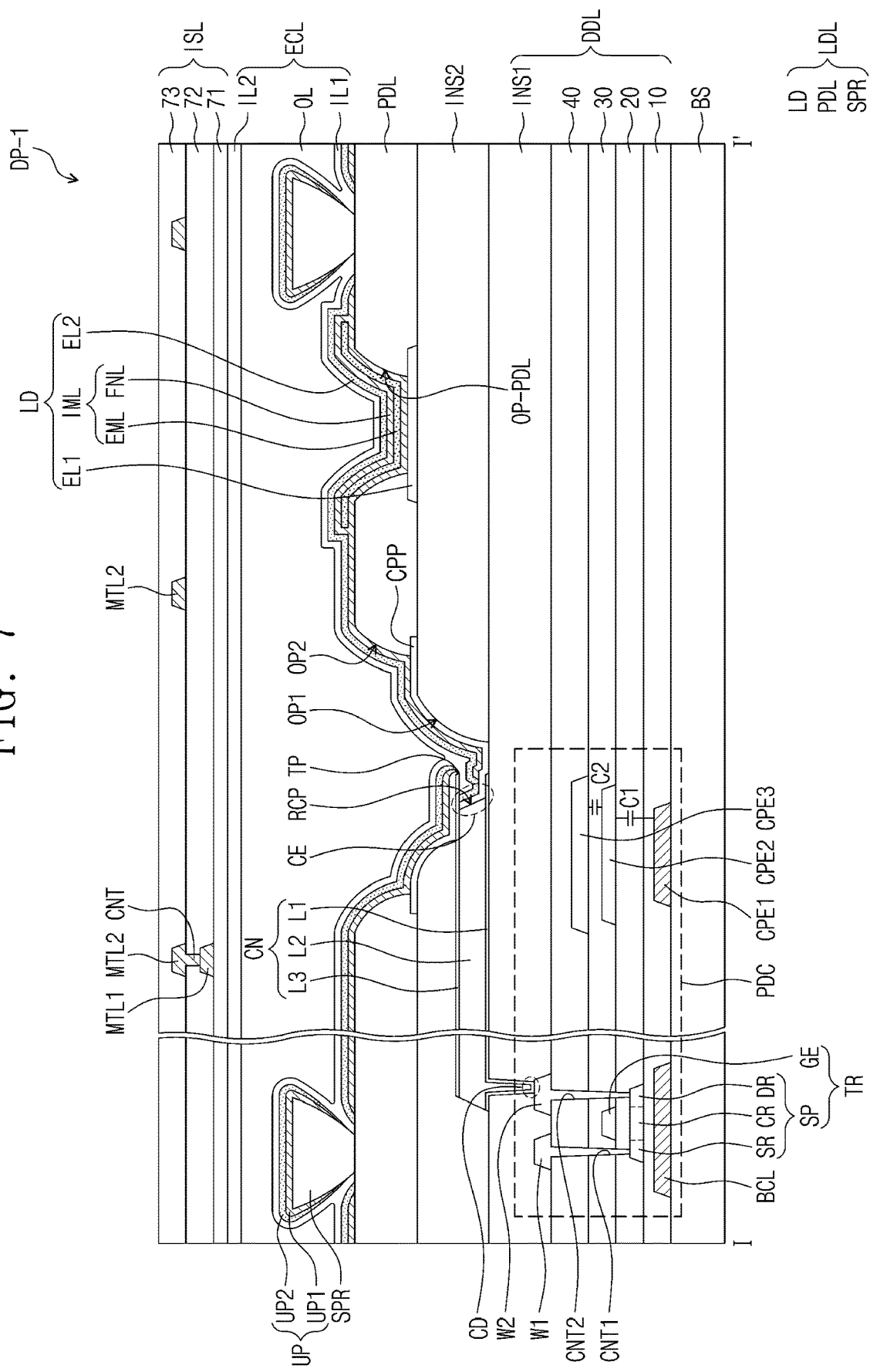
FIG. 7 is a schematic cross-sectional view of a display panel according to an embodiment.

FIG. 7 is a schematic cross-sectional view of a display panel DP-1 according to an embodiment. For the convenience of explanation, FIG. 7 shows a cross-section of an area corresponding to that of FIG. 5. In FIG. 7, the same reference numerals denote the same elements in FIG. 5, and thus, detailed descriptions of the same elements may be omitted.

The display panel DP-1 shown in FIG. 7 may further include a capping pattern CPP compared with the display panel DP shown in FIG. 5. The capping pattern CPP may be disposed on a sixth insulating layer INS2. The capping pattern CPP may also be disposed on a portion of a connection wiring CN, which is exposed via a first opening OP1 defined through the sixth insulating layer INS2. The capping pattern CPP may be disposed to overlap the connection wiring CN. In detail, the capping pattern CPP may be disposed to overlap an emission connection part CE and/or a tip part TP.

As shown in FIG. 7, the capping pattern CPP may be partially disconnected by the tip part TP in case that viewed in a schematic cross-section. However, when viewed in the plan view, the capping pattern CPP may have an integral shape that is connected as a whole in an area defined as a closed line (refer to FIG. 4A) by a separator. One end or an end of the capping pattern CPP that is partially disconnected may be in contact with a side surface of a second layer L2 of the connection wiring CN, and the other end of the capping pattern CPP may be disposed on a third layer L3 of the connection wiring CN to cover the tip part TP.

The capping pattern CPP may include a conductive material. Accordingly, the second electrode EL2 may be electrically connected to the connection wiring CN through the capping pattern CPP. For example, the capping pattern CPP may be in contact with the side surface of the second layer L2 of the connection wiring CN, the second electrode EL2 may be in contact with the capping pattern CPP, and thus, the capping pattern CPP, the second layer L2 of the connection wiring CN, and the second electrode EL2 may be electrically connected to each other. As the capping pattern CPP is placed relatively outside of the second layer L2 of the connection wiring, the second electrode EL2 may be electrically connected to the second layer L2 by only being connected to the capping pattern CPP instead of being connected to the side surface of the second layer L2, and thus, the connection wiring CN and the second electrode EL2 may be more readily connected to each other.

The capping pattern CPP may include a material with a relatively low reactivity compared with the second layer L2 of the connection wiring CN. As an example, the capping pattern CPP may include copper (Cu), silver (Ag), a transparent conductive oxide, or the like within the spirit and the scope of the disclosure. As the side surface of the second layer L2 of the connection wiring CN is protected by the capping pattern CPP with the relatively low reactivity, an oxidation of materials included in the second layer L2 may be prevented. Further, during an etching process of patterning the first electrode EL1, component, such as silver (Ag), contained in the first electrode EL1 may be prevented from being reduced and remaining as particles causing defects.

The capping pattern CPP may be formed through the same process as the first electrode EL1 and may include the same material or similar material as the first electrode EL1, however, this is an example. According to an embodiment, the capping pattern CPP and the first electrode EL1 may be formed through different processes and may include different materials.

Figure 8:
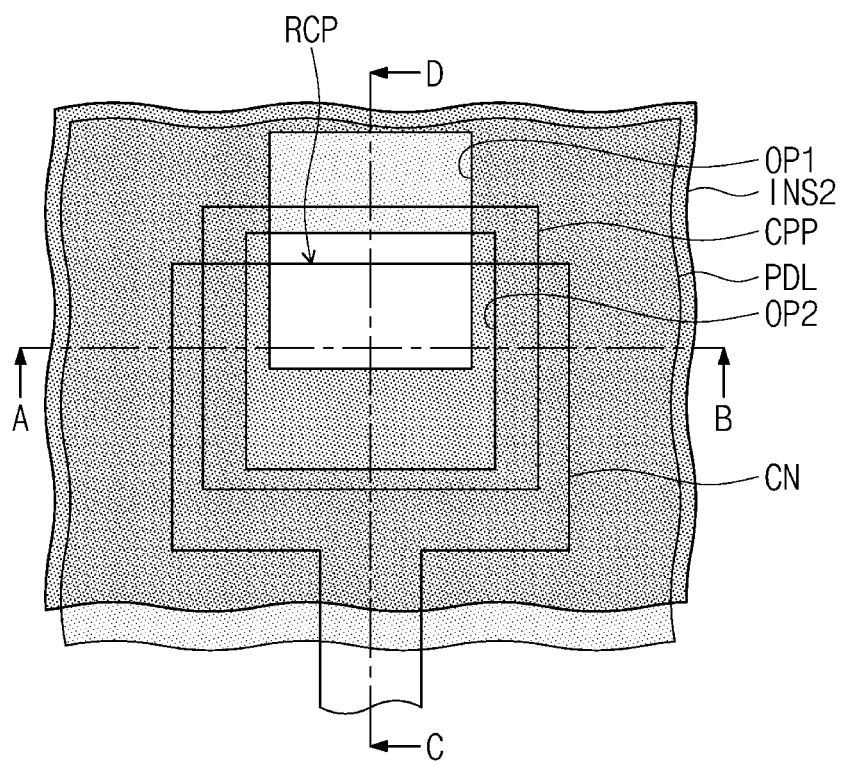
FIG. 8 is a schematic plan view of a connection wiring, a pixel definition layer, an upper insulating layer, and a capping pattern in an area corresponding to an area AA' of FIG. 4A.

FIG. 8 is a schematic plan view of the connection wiring CN, the pixel definition layer PDL, the upper insulating layer INS2, and the capping pattern CPP in an area corresponding to an area AA' of FIG. 4A.

Referring to FIG. 8, one side surface or a side surface among plural side surfaces of the connection wiring CN may be exposed via the first opening OP1 defined through the upper insulating layer INS2. The exposed portion of the connection wiring CN may be a connection portion RCP. The first opening OP1 may have a quadrangular shape. However, this is an example, and the first opening OP1 may have a variety of shapes.

The capping pattern CPP may entirely cover the connection portion RCP of the connection wiring CN, which is exposed via the first opening OP1, and a size of the capping pattern CPP may be reduced. As the size of the capping pattern CPP is reduced, a gas generated from the upper insulating layer INS2 may be readily dissipated without being blocked by the capping pattern CPP. The pixel definition layer PDL may completely cover a boundary or an edge of the capping pattern CPP, and a size of a second opening OP2 defined through the pixel definition layer PDL may be reduced. As the size of the pixel definition layer PDL is reduced, a size of the light emitting opening OP-PDL (refer to FIG. 7) may increase, an area in which the pixel is disposed may be more secured in the display panel DP-1, and thus, a resolution of the display panel DP-1 may be improved. Embodiments described later are designed to secure the above-mentioned effects, however, they should not be particularly limited. In addition to the embodiments described with reference to FIGS. 8 to 21, the display panel may be designed in various shapes to obtain the above-mentioned effects.

Figure 9:
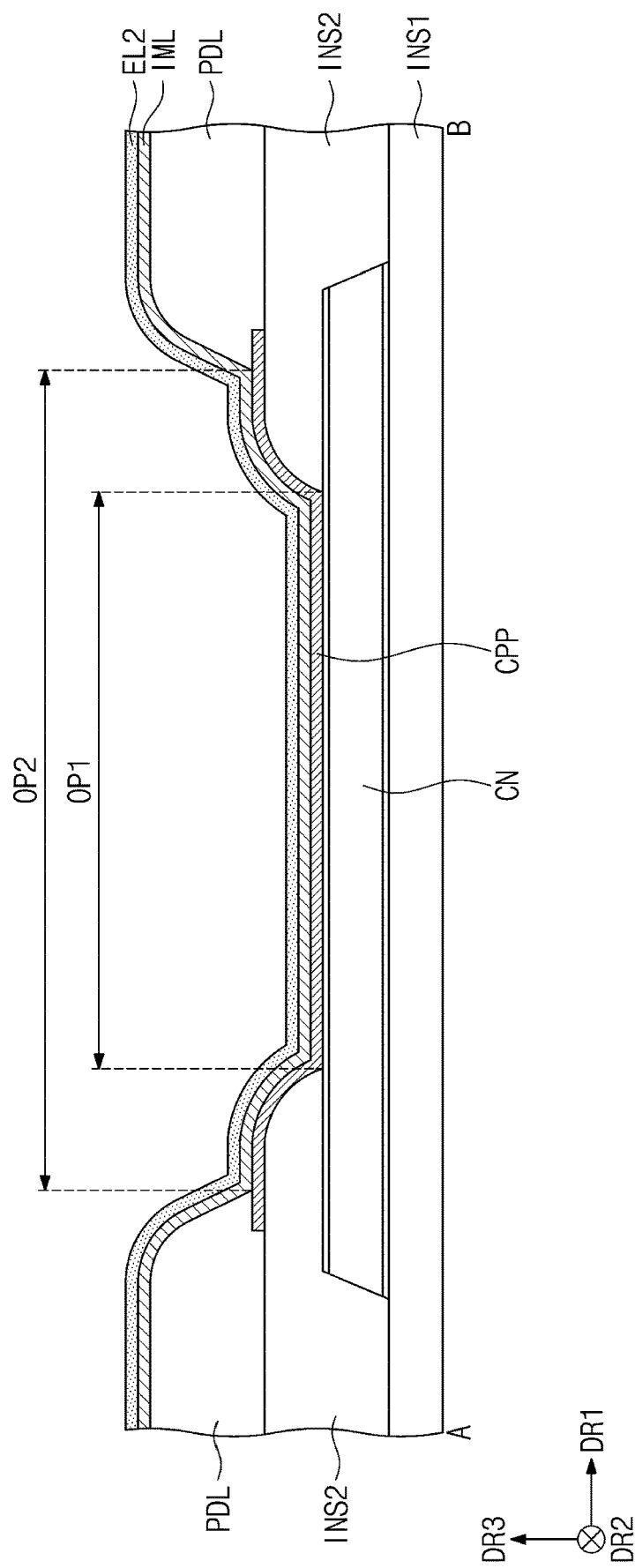
FIGS. 9 and 10 are schematic cross-sectional views of a portion of a display panel according to an embodiment.

FIG. 9 is a schematic cross-sectional view of a portion of the display panel DP-1 (refer to FIG. 7) according to an embodiment. A schematic cross-sectional view taken along line A-B shown in FIG. 8 may be substantially the same as that of FIG. 9.

Referring to FIG. 9, the pixel definition layer PDL may not overlap the first opening OP1. The second opening OP2 of the pixel definition layer PDL may be greater than the first opening OP1 of the upper insulating layer INS2. The capping pattern CPP may entirely overlap the first opening OP1 in the schematic cross-sectional view taken along the line A-B.

Figure 10:
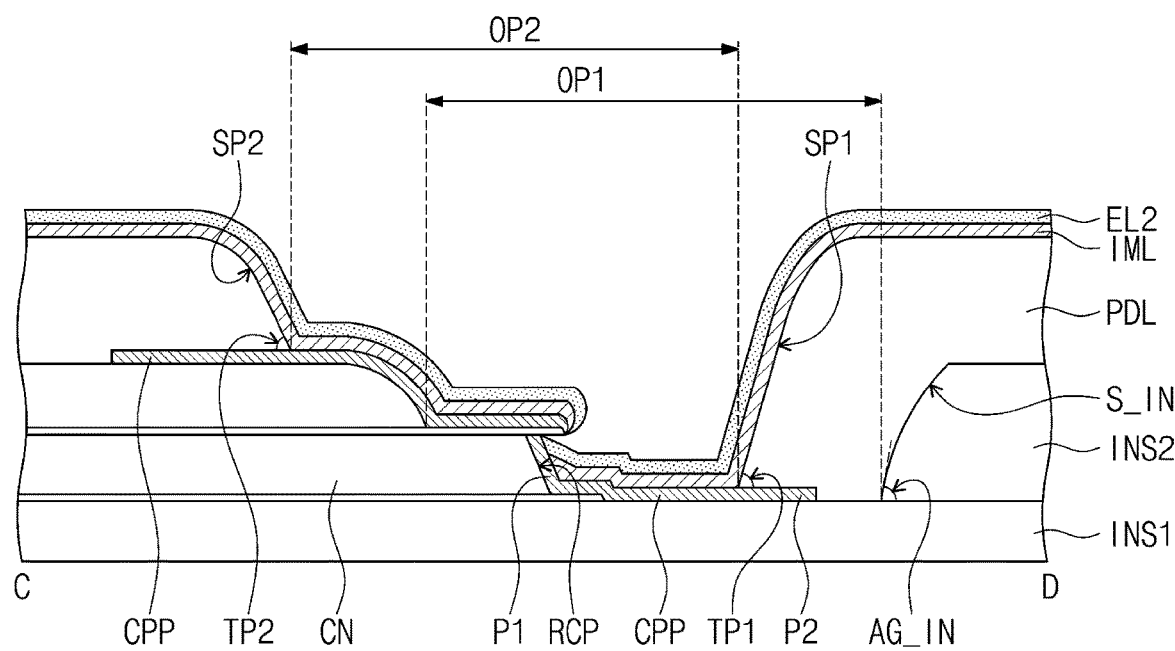
Figure 10:
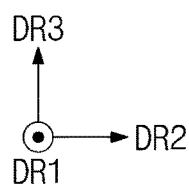

FIG. 10 is a schematic cross-sectional view of a portion of the display panel DP-1 (refer to FIG. 7) according to an embodiment. A schematic cross-sectional view taken along line C-D shown in FIG. 8 may be substantially the same as that of FIG. 10.

Referring to FIG. 10, the pixel definition layer PDL may cover the first opening OP1 while covering a portion of the capping pattern CPP disposed on a lower insulating layer INS1. The capping pattern CPP may include a first portion P1 adjacent to the side surface of the connection wiring CN and a second portion P2 spaced apart from the connection wiring CN. The first portion P1 may be in contact with the connection portion RCP of the connection wiring CN, and the second portion P2 may be disposed on the lower insulating layer INS1 and may be covered by the pixel definition layer PDL. The second portion P2 of the capping pattern CPP may not overlap the upper insulating layer INS2.

The pixel definition layer PDL may include a first slant surface SP1 and a second slant surface SP2. The first slant surface SP1 may be defined in the pixel definition layer PDL covering the fourth portion P4 of the capping pattern CPP, and the second slant surface SP2 may be defined in the pixel definition layer PDL disposed on the upper insulating layer INS2. A side surface S_IN of the upper insulating layer INS2 may be a slant surface defined in the upper insulating layer INS2 defining the first opening OP1.

An angle TP1 between an upper surface of the lower insulating layer INS1 and the first slant surface SP1 may be referred to as a first angle TP1, and an angle TP2 between an upper surface of the upper insulating layer INS2 and the second slant surface SP2 may be referred to as a second angle TP2. The first angle TP1 may be greater than the second angle TP2. The first angle TP1 may be equal to or greater than about 50 degrees and equal to or smaller than about 70 degrees, and the second angle TP2 may be equal to or greater than about 40 degrees and equal to or smaller than about 55 degrees. An angle AG_IN between the upper surface of the lower insulating layer INS1 and the side surface S_IN of the upper insulating layer INS2 may be equal to or greater than about 40 degrees and equal to or smaller than about 55 degrees.

According to an embodiment, the pixel definition layer PDL may cover a portion of the side surface of the upper insulating layer INS2. Accordingly, the capping pattern CPP may not be required to cover the upper insulating layer INS2, and thus, a length of the capping pattern CPP may be shortened. Therefore, the size of the second opening OP2 of the pixel definition layer PDL may be reduced, and thus, the area in which the pixel is disposed may be more secured in the display panel DP-1 (refer to FIG. 7). As a result, a resolution of the display panel DP-1 may be improved.

Since the capping pattern CPP does not cover the upper insulating layer INS2, the gas generated from the upper insulating layer INS2 may be readily dissipated without being blocked by the capping pattern CPP. Accordingly, as the gas generated during the process may be readily dissipated, a lifespan of the pixel may be lengthened.

In FIGS. 9 and 10, the shape and size of the connection wiring CN are examples, and the disclosure should not be limited thereto or thereby. The shape and size of the connection wiring CN may vary depending on the structure of the display panel DP-1 (refer to FIG. 7), and the shape and size of the capping pattern CPP may vary depending on the shape and size of the connection wiring CN.

Figure 11:
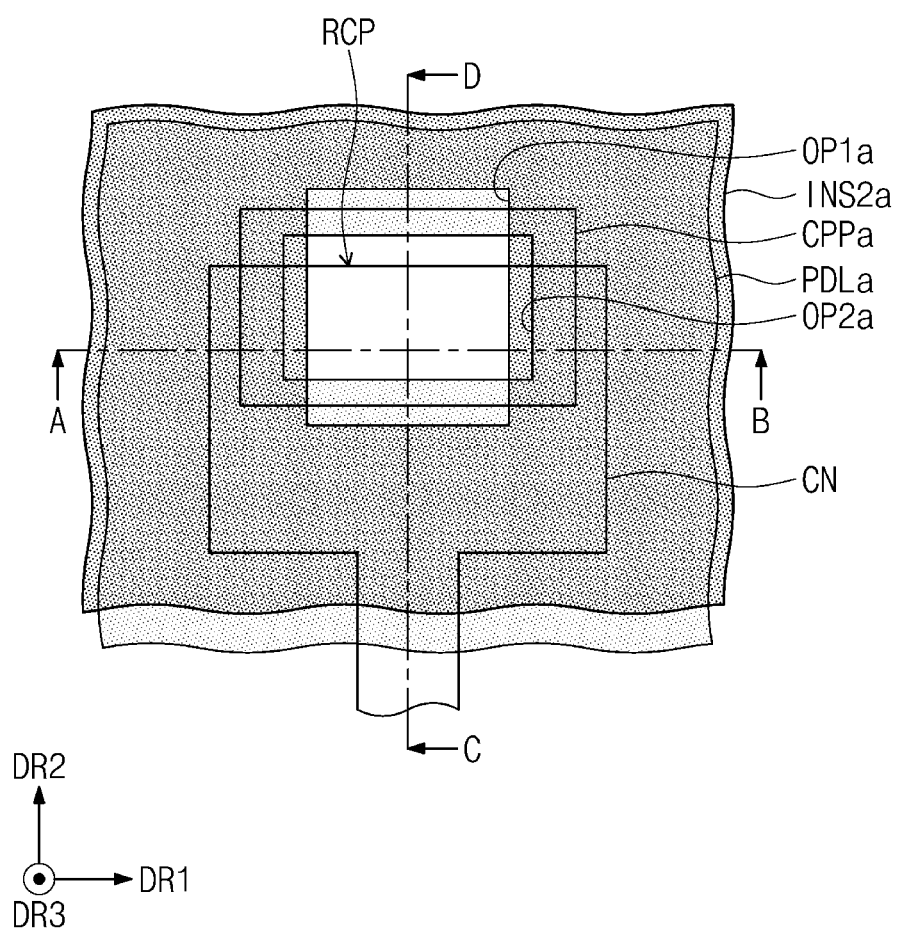
FIGS. 11 and 12 are schematic plan views of a connection wiring, a pixel definition layer, an upper insulating layer, and a capping pattern in an area corresponding to an area AA' of FIG. 4A.

FIG. 11 is a schematic plan view of a connection wiring CN, a pixel definition layer PDLa, an upper insulating layer INS2a, and a capping pattern CPPa in an area corresponding to an area AA' of FIG. 4A.

Referring to FIGS. 8 and 11, the descriptions of first opening OP1a of the FIG. 11 may be substantially the same as the descriptions of the first opening OP1 of the FIG. 8. The capping pattern CPPa of FIG. 11 may have a size smaller than a size of the capping pattern CPP of FIG. 8. As an example, a width in the second direction DR2 of the capping pattern CPPa of FIG. 11 may be smaller than a width in the second direction DR2 of the capping pattern CPP of FIG. 8. The capping pattern CPPa may have a shape designed to allow a gas generated from the upper insulating layer INS2a to be readily dissipated. As the size of the capping pattern CPPa decreases, the gas generated from the upper insulating layer INS2a may be readily dissipated without being blocked by the capping pattern CPPa.

A size of a second opening OP2a of the pixel definition layer PDLa of FIG. 11 may be smaller than the size of the second opening OP2 of FIG. 8. As an example, a width in the second direction DR2 of the second opening OP2a of FIG. 11 may be smaller than a width in the second direction DR2 of the second opening OP2 of FIG. 8. The second opening OP2a may have a shape designed to secure a light emitting area. As the size of the second opening OP2a decreases, the size of the light emitting opening OP-PDL (refer to FIG. 7) may increase, and the area in which the pixel is disposed may be more secured in the display panel DP-1. As a result, the resolution of the display panel DP-1 may be improved.

FIGS. 8 to 11 show the structures in which the capping pattern CPP or CPPa is present as a representative example, however, the shape of the second opening OP2 (refer to FIG. 5) of the pixel definition layer PDL (refer to FIG. 5) may be changed to secure the above-mentioned effects in the display panel DP (refer to FIG. 5) that does not include the capping pattern CPP or CPPa.

Figure 12:
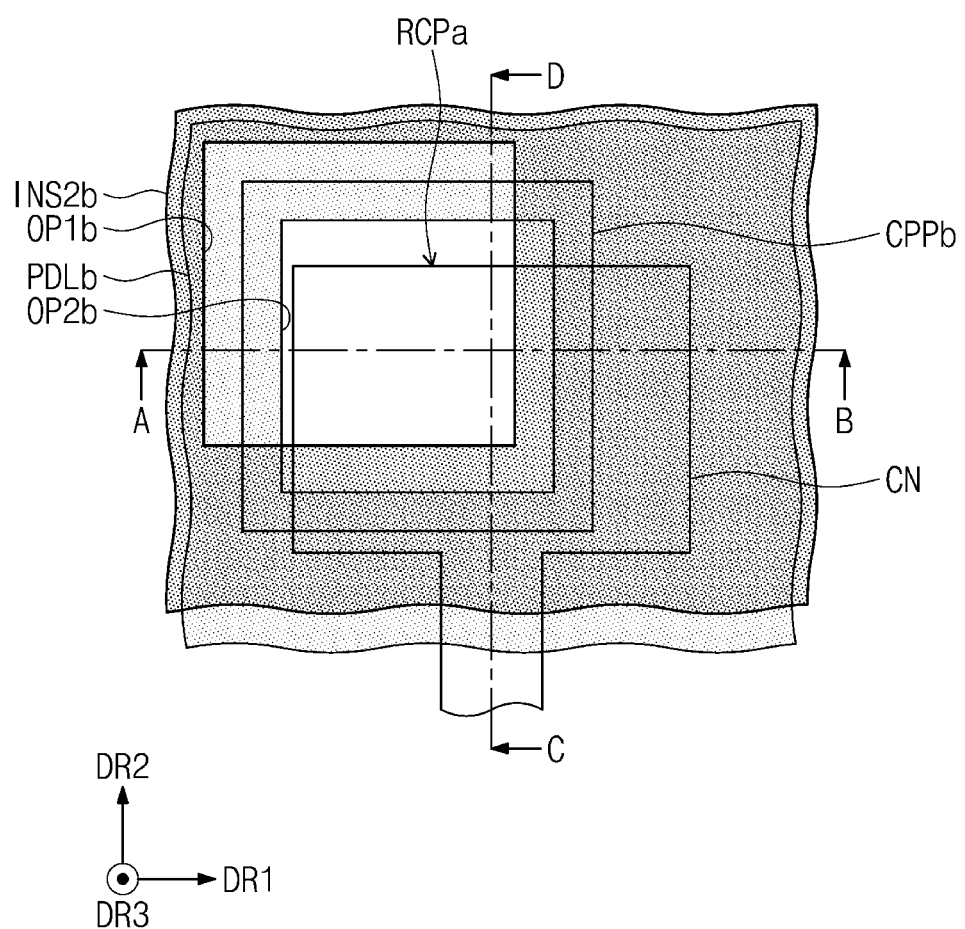

FIG. 12 is a schematic plan view of a connection wiring CN, a pixel definition layer PDLb, an upper insulating layer INS2b, and a capping pattern CPPb in an area corresponding to an area AA' of FIG. 4A. In FIG. 12, the same reference numerals denote the same elements in FIG. 8, and thus, detailed descriptions of the same elements may be omitted.

Referring to FIG. 12, two side surfaces of side surfaces of the connection wiring CN may be exposed via a first opening OP1b defined through the upper insulating layer INS2b. The two side surfaces may be adjacent to each other and may be connected to each other. An exposed portion of the connection wiring CN may be a connection portion RCPa. The first opening OP1b may have a quadrangular shape. However, this is an example, and the first opening OP1b may have a variety of shapes. The capping pattern CPPb may cover the connection portion RCPa of the connection wiring CN, which is exposed through the first opening OP1b. The pixel definition layer PDLb may cover a boundary or an edge of the capping pattern CPPb.

Figure 13:
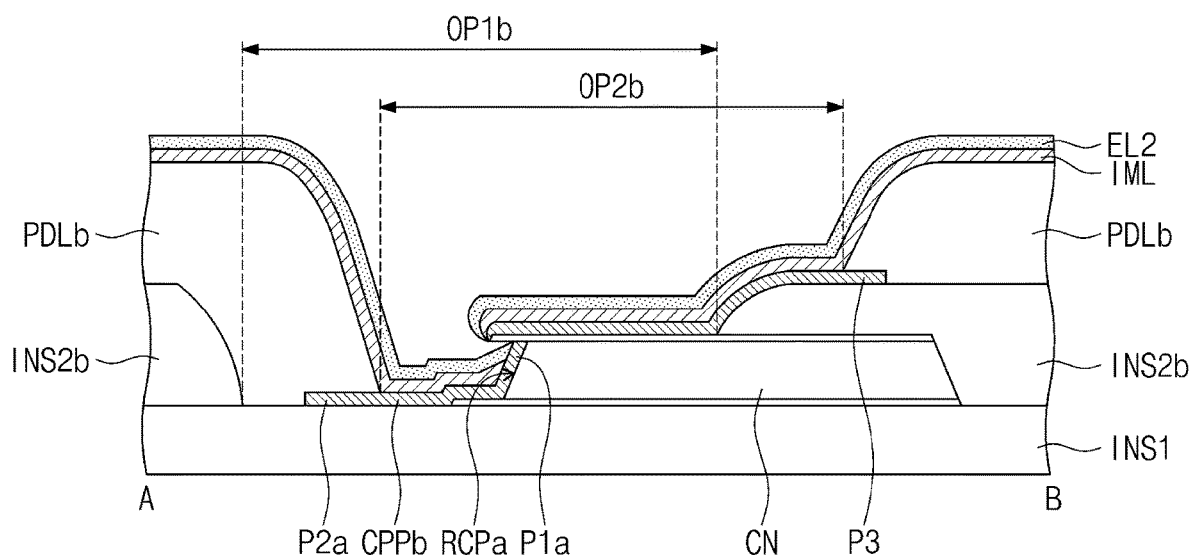
FIG. 13 is a schematic cross-sectional view of a portion of a display panel according to an embodiment.
Figure 13:
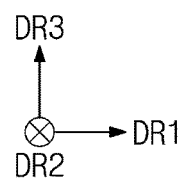

FIG. 13 is a schematic cross-sectional view of a portion of the display panel DP-1 (refer to FIG. 7) according to an embodiment. A schematic cross-sectional view taken along line A-B shown in FIG. 12 may be substantially the same as that of FIG. 13, and a schematic cross-sectional view taken along line C-D shown in FIG. 12 may be substantially the same as that of FIG. 10. Accordingly, descriptions about the schematic cross-section taken along the line C-D of FIG. 12 may be omitted.

Referring to FIG. 13, a portion of the pixel definition layer PDLb may overlap a portion of the first opening OP1b. A second opening OP2b of the pixel definition layer PDLb may overlap the first opening OP1b of the upper insulating layer INS2b. In the schematic cross-sectional view taken along the line A-B of FIG. 12, the capping pattern CPPb may overlap a portion of the first opening OP1b and may entirely overlap the second opening OP2b.

The capping pattern CPPb may include first portion P1a adjacent to a side surface of the connection wiring CN and second and third portions P2a and P3 spaced apart from the connection wiring CN. The first portion P1a may be in contact with the connection portion RCPa of the connection wiring CN. The second-first portion P2a may be disposed on a lower insulating layer INS1 and may be covered by the pixel definition layer PDLb. The third portion P3 may be disposed on the upper insulating layer INS2b and may be covered by the pixel definition layer PDLb. For example, the second portion P2a of the capping pattern CPPb may be formed not to overlap the upper insulating layer INS2b, and the third portion P3 of the capping pattern CPPb may be formed to overlap the upper insulating layer INS2b.

As the second-first portion P2a-1 is formed not to overlap the upper insulating layer INS2b, a size of the capping pattern CPPb may be reduced while entirely covering the connection portion RCPa. As the size of the capping pattern CPPb is reduced, a gas generated from the upper insulating layer INS2b may be readily dissipated without being blocked by the capping pattern CPPb. The pixel definition layer PDLb may entirely cover a boundary of the capping pattern CPPb, and a size of the second opening OP2b may be reduced. As the size of the pixel definition layer PDLb is reduced, a size of the light emitting opening OP-PDL (refer to FIG. 5) may increase, and the area in which the pixel is disposed may be more secured in the display panel DP-1. As a result, the resolution of the display panel DP-1 may be improved.

Figure 14:
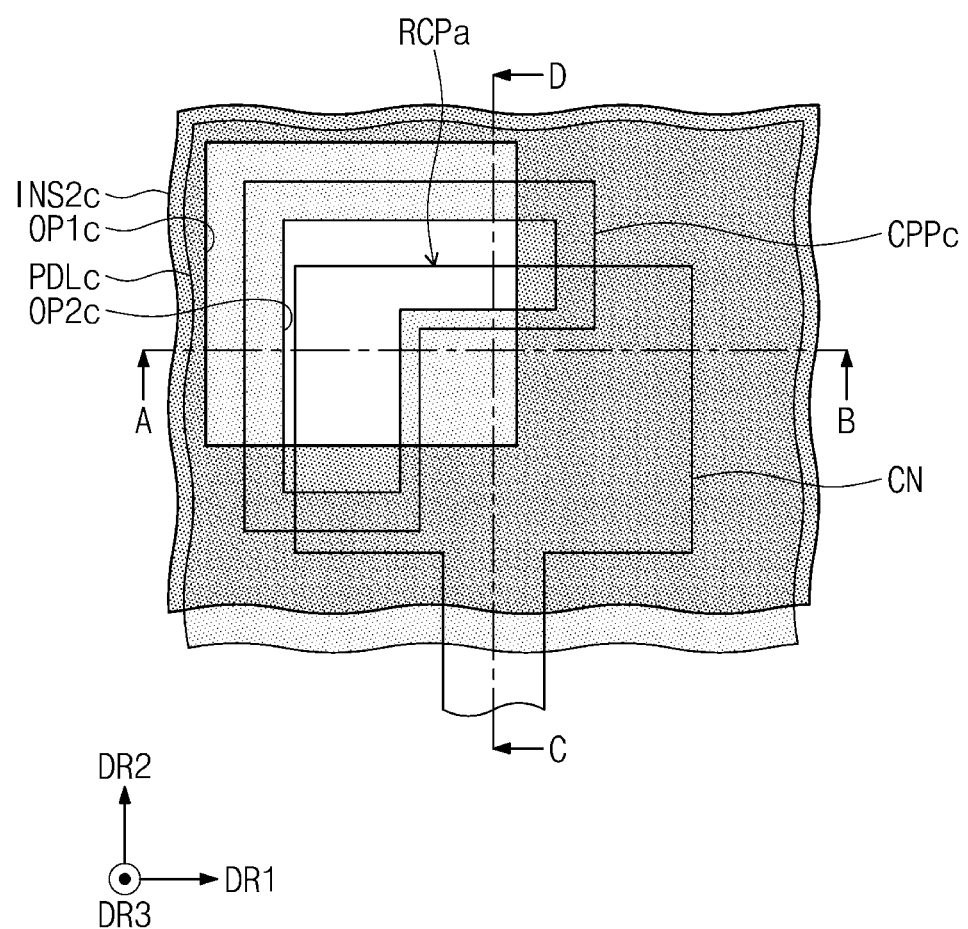
FIGS. 14 and 15 are schematic plan views of a connection wiring, a pixel definition layer, an upper insulating layer, and a capping pattern in an area corresponding to an area AA' of FIG. 4A.

FIG. 14 is a schematic plan view of a connection wiring CN, a pixel definition layer PDLc, an upper insulating layer INS2c, and a capping pattern CPPc in an area corresponding to an area AA' of FIG. 4A.

Referring to FIGS. 12 and 14, the descriptions of first opening OP1c of the FIG. 14 may be substantially the same as the descriptions of the first opening OP1b of the FIG. 12. A size of the capping pattern CPPc of FIG. 14 may be smaller than the size of the capping pattern CPPb of FIG. 12. As an example, the capping pattern CPPc of FIG. 14 may have a shape obtained by removing a portion of the capping pattern CPPb, which overlaps the connection wiring CN, shown in FIG. 12. FIG. 14 shows the capping pattern CPPc having an L-shape rotated in a clockwise direction by about 90 degrees and obtained by removing a portion of the capping pattern CPPb of FIG. 12 having a quadrangular shape. The shape of the capping pattern CPPc may be designed to readily dissipate a gas generated from the upper insulating layer INS2c. As the size of the capping pattern CPPc decreases, the gas generated from the upper insulating layer INS2c may be readily dissipated without being blocked by the capping pattern CPPc.

A size of a second opening OP2c of the pixel definition layer PDLc of FIG. 14 may be smaller than the size of the second opening OP2b of FIG. 12. As an example, the second opening OP2c of FIG. 14 may have a shape obtained by removing a portion of the second opening OP2b, which overlaps the connection wiring CN, shown in FIG. 12. FIG. 14 shows the second opening OP2c having an L-shape rotated in a clockwise direction by about 90 degrees and obtained by removing a portion of the second opening OP2b of FIG. 12 having a quadrangular shape. The shape of the pixel definition layer PDLc may be designed to improve the resolution of the display panel DP-1 (refer to FIG. 7). As the size of the second opening OP2c decreases, the size of the light emitting opening OP-PDL (refer to FIG. 7) may increase, and the area in which the pixel is disposed may be secured in the display panel DP-1. As a result, the resolution of the display panel DP-1 may be improved.

FIGS. 12 to 14 show the structures in which the capping pattern CPPb or CPPc is present as a representative example, however, the shape of the second opening OP2 (refer to FIG. 5) of the pixel definition layer PDL (refer to FIG. 5) may be changed to secure the above-mentioned effects in the display panel DP (refer to FIG. 5) that does not include the capping pattern CPPb or CPPc.

Figure 15:
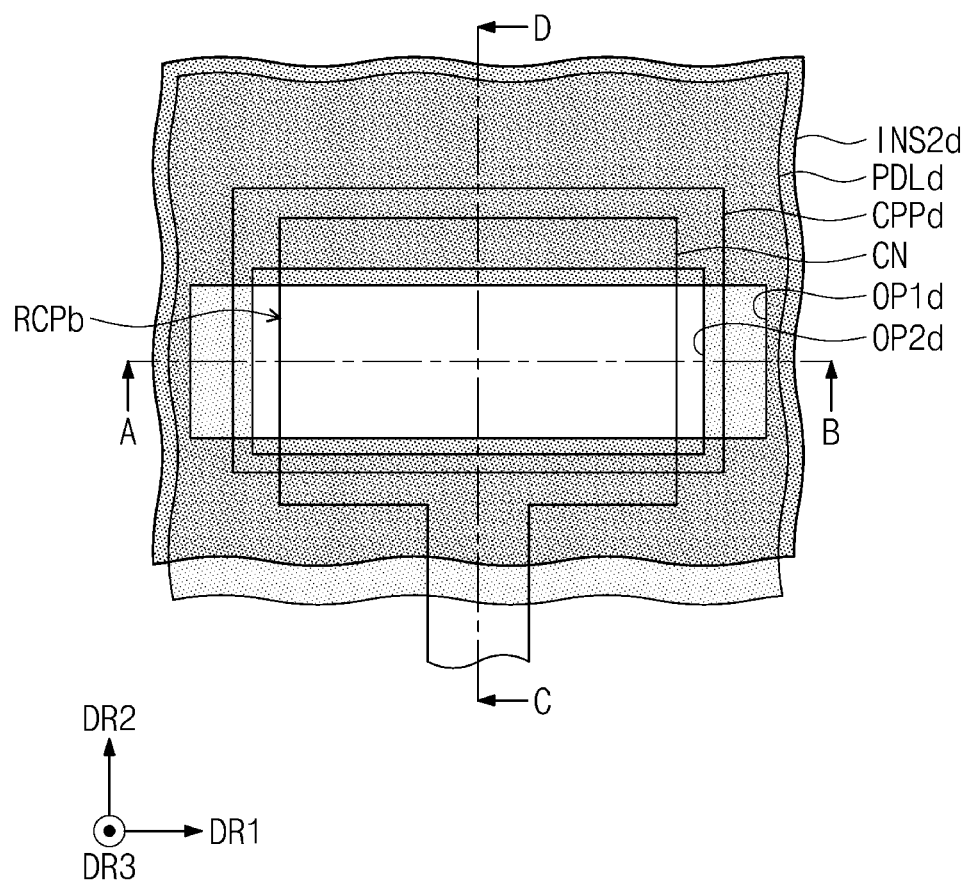

FIG. 15 is a schematic plan view of a connection wiring CN, a pixel definition layer PDLd, an upper insulating layer INS2d, and a capping pattern CPPd in an area corresponding to an area AA' of FIG. 4A.

Referring to FIG. 15, two side surfaces of side surfaces of the connection wiring CN may be exposed via a first opening OP1d defined through the upper insulating layer INS2d. The two side surfaces may face each other. The exposed portion of the connection wiring CN may be a connection portion RCPb. The first opening OP1d may have a quadrangular shape. However, this is an example, and the first opening OP1d may have a variety of shapes. The capping pattern CPPd may cover the connection portion RCPb of the connection wiring CN, which is exposed via the first opening OP1d. The pixel definition layer PDLd may cover a boundary or an edge of the capping pattern CPPd.

Figure 16:
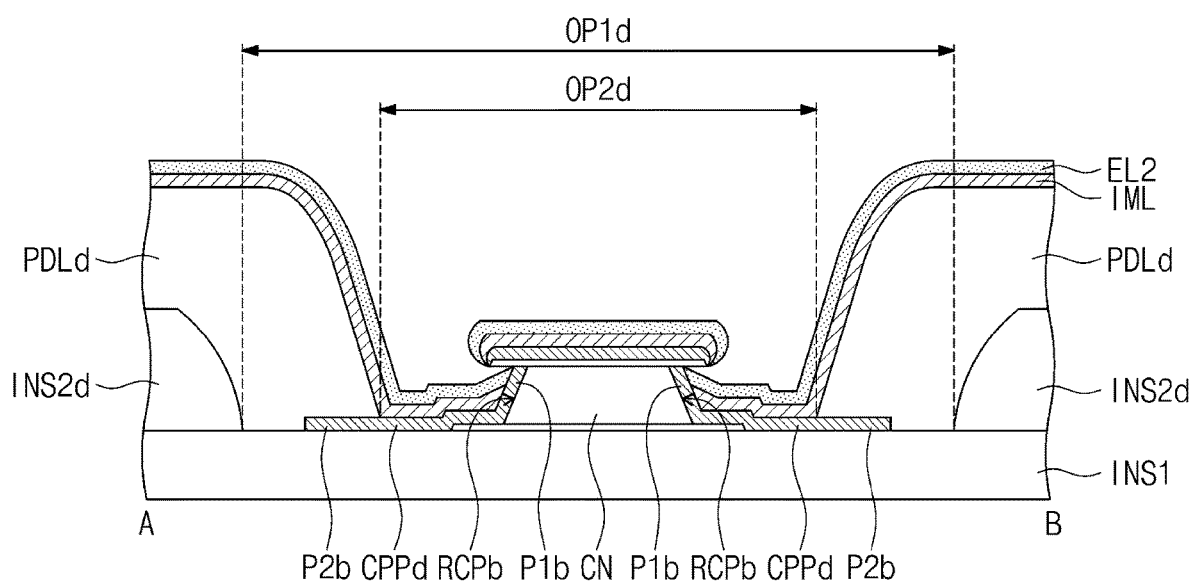
FIGS. 16 and 17 are schematic cross-sectional views of a portion of a display panel according to an embodiment.

FIG. 16 is a schematic cross-sectional view of a portion of a display panel DP-1 (refer to FIG. 7) according to an embodiment. A schematic cross-sectional view taken along line A-B shown in FIG. 15 may be substantially the same as that of FIG. 16.

Referring to FIGS. 15 and 16, the pixel definition layer PDLd may overlap the first opening OP1d. The first opening OP1d of the upper insulating layer INS2d may be greater than a second opening OP2d of the pixel definition layer PDLd. In the schematic cross-sectional view taken along the line A-B of FIG. 15, the capping pattern CPPd may overlap the first opening OP1d. For example, a width in the first direction DR1 of the second opening OP2d of the upper insulating layer INS2d may be greater than a width in the first direction DR1 of the capping pattern CPPd, and the width in the first direction DR1 of the capping pattern CPPd may be greater than a width in the first direction DR1 of the second opening OP2d of the pixel definition layer PDLd.

The capping pattern CPPd may include first portions P1b adjacent to the side surface of the connection wiring CN and second portions P2b spaced apart from the connection wiring CN. The first portions P1b may be in contact with the connection portion RCPb of the connection wiring CN, and the second portions P2b may be disposed on a lower insulating layer INS1 and may be covered by the pixel definition layer PDLd. For example, the second portions P2b of the capping pattern CPPd may be formed not to overlap the upper insulating layer INS2d. Since the capping pattern CPPd does not cover the upper insulating layer INS2d, the gas generated from the upper insulating layer INS2d may be readily dissipated without being blocked by the capping pattern CPPd.

Figure 17:
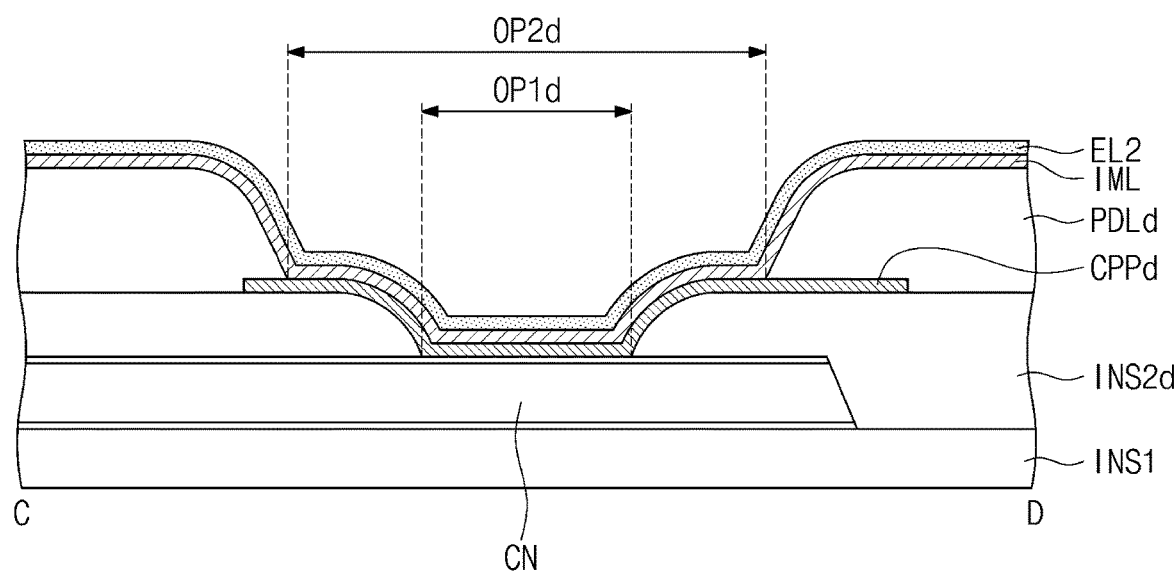

FIG. 17 is a schematic cross-sectional view of a portion of a display panel DP-1 (refer to FIG. 7) according to an embodiment. The schematic cross-sectional view taken along line C-D shown in FIG. 15 may be substantially the same as that of FIG. 17.

Referring to FIG. 17, the first opening OP1d of the upper insulating layer INS2d may overlap the second opening OP2d of the pixel definition layer PDLd. As an example, the second opening OP2d of the pixel definition layer PDLd may have a size greater than a size of the first opening OP1d of the upper insulating layer INS2d. Both ends of the capping pattern CPPd may be disposed on the upper insulating layer INS2d and may be covered by the pixel definition layer PDLd. Additionally, both ends of the capping pattern CPPd may be formed to overlap the upper insulating layer INS2d. One end of the two ends of the capping pattern CPPd may overlap the connection wiring CN, and the other end of the two ends of the capping pattern CPPd may not overlap the connection wiring CN.

Figure 18:
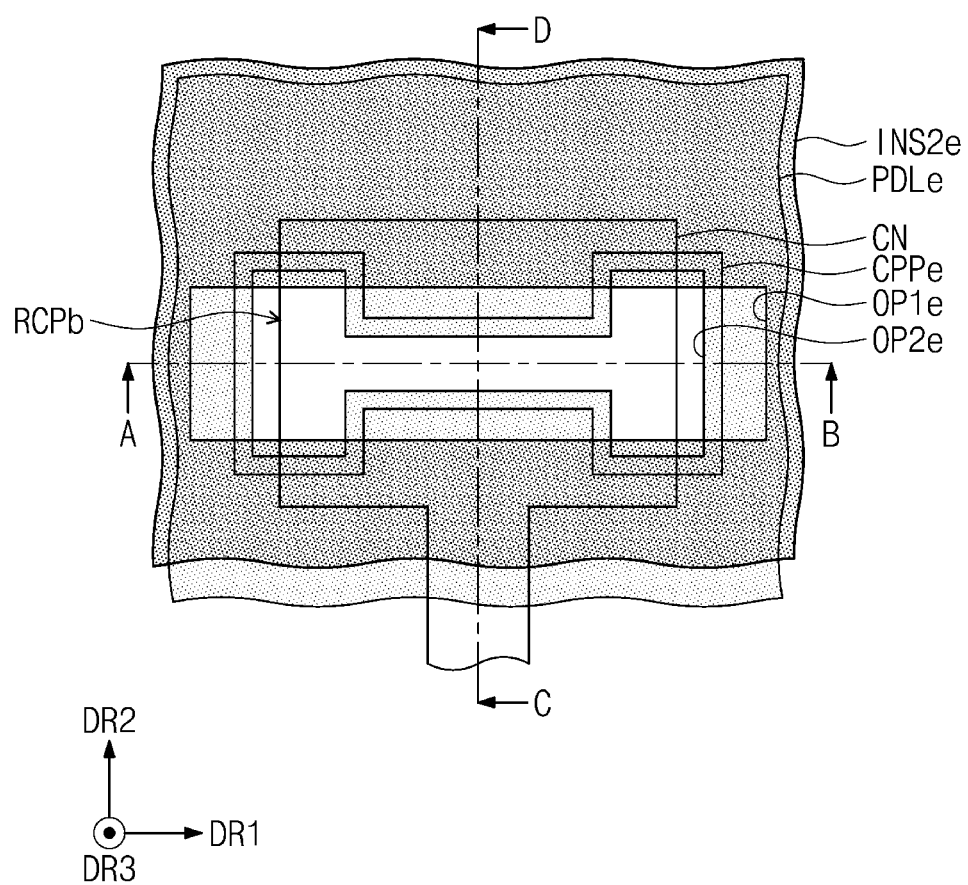
FIGS. 18 to 20 are schematic plan views of a connection wiring, a pixel definition layer, an upper insulating layer, and a capping pattern in an area corresponding to an area AA' of FIG. 4A.

FIG. 18 is a schematic plan view of a connection wiring CN, a pixel definition layer PDLe, an upper insulating layer INS2e, and a capping pattern CPPe in an area corresponding to an area AA' of FIG. 4A.

Referring to FIGS. 15 and 18, the descriptions of first opening OP1e of the FIG. 18 may be substantially the same as the descriptions of the first opening OP1d of the FIG. 15. The capping pattern CPPe may have a size smaller than that of the capping pattern CPPd of FIG. 15. As an example, the capping pattern CPPe of FIG. 18 may have a shape obtained by removing a portion from the capping pattern CPPd, which overlaps the connection wiring CN, shown in FIG. 15. FIG. 18 shows the capping pattern CPPe having a dumbbell shape obtained by removing two rectangular portions from the capping pattern CPPd as a representative example. The capping pattern CPPe may have the shape designed to readily dissipate a gas generated from the upper insulating layer INS2e. As the size of the capping pattern CPPe decreases, the gas generated from the upper insulating layer INS2e may be readily dissipated without being blocked by the capping pattern CPPe.

A size of a second opening OP2e of the pixel definition layer PDLe of FIG. 18 may be smaller than the size of the second opening OP2d of FIG. 15. As an example, the second opening OP2e of FIG. 18 may have a shape obtained by removing a portion of the second opening OP2d, which overlaps the connection wiring CN, shown in FIG. 15. FIG. 18 shows the second opening OP2e having a dumbbell shape obtained by removing two rectangular portions from the second opening OP2d as a representative example. The pixel definition layer PDLe may have the shape designed to improve the resolution of the display panel DP-1 (refer to FIG. 7). As the size of the second opening OP2e decreases, the size of the light emitting opening OP-PDL (refer to FIG. 7) may increase, and the area in which the pixel is disposed may be more secured in the display panel DP-1. As a result, the resolution of the display panel DP-1 may be improved.

FIGS. 15 to 18 show the structures in which the capping pattern CPPd or CPPe is present as a representative example, however, the shape of the second opening OP2 (refer to FIG. 5) of the pixel definition layer PDL (refer to FIG. 5) may be changed to secure the above-mentioned effects in the display panel DP (refer to FIG. 5) that does not include the capping pattern CPPd or CPPe.

Figure 19:
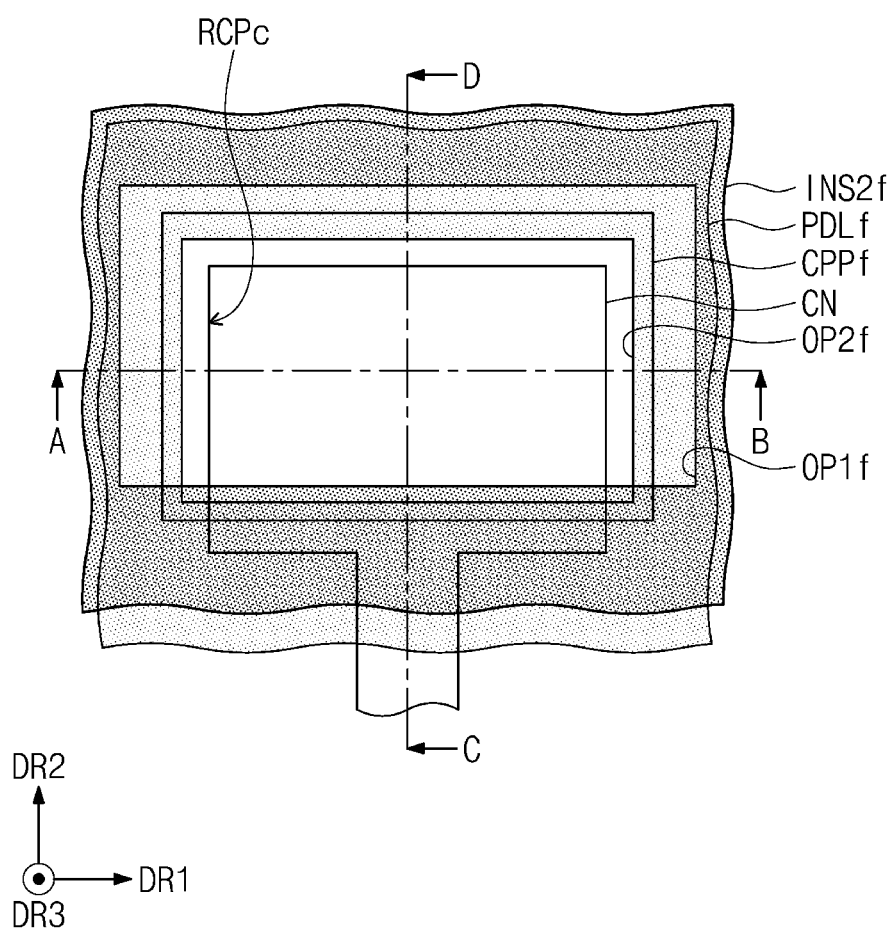

FIG. 19 is a schematic plan view of a connection wiring CN, a pixel definition layer PDLf, an upper insulating layer INS2f, and a capping pattern CPPf in an area corresponding to an area AA' of FIG. 4A. In FIG. 19, the same reference numerals denote the same elements in FIG. 8, and thus, detailed descriptions of the same elements may be omitted.

Referring to FIG. 19, three side surfaces among side surfaces of the connection wiring CN may be exposed via a first opening OP1f defined through the upper insulating layer INS2f. The exposed portion of the connection wiring CN may be a connection portion RCPc. The first opening OP1f may have a quadrangular shape. However, this is an example, and the first opening OP1f may have a variety of shapes. The capping pattern CPPf may cover the connection portion RCPc of the connection wiring CN exposed via the first opening OP1f. The pixel definition layer PDLf may cover a boundary or an edge of the capping pattern CPPf.

A schematic cross-sectional view taken along line A-B shown in FIG. 19 may be substantially the same as that of FIG. 16, and a schematic cross-sectional view taken along line C-D shown in FIG. 19 may be substantially the same as that of FIG. 10. Accordingly, detailed descriptions about the schematic cross-sections respectively taken along the lines A-B and C-D may be omitted.

Figure 20:
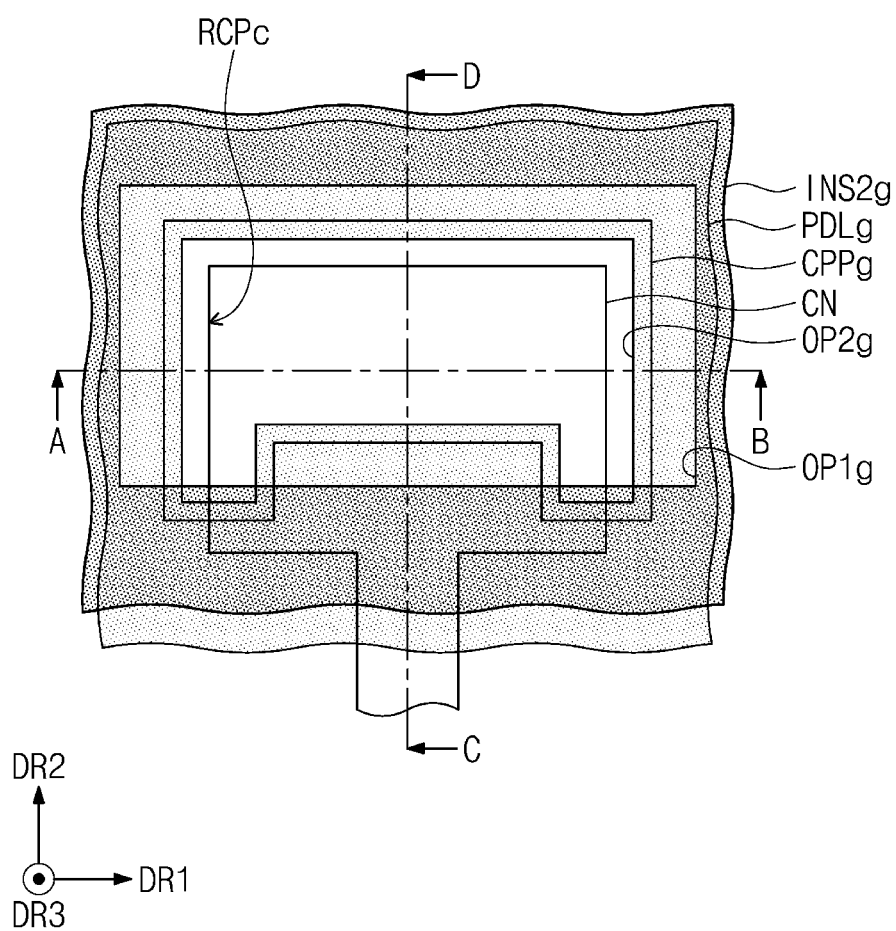

FIG. 20 is a schematic plan view of a connection line CN, a pixel definition layer PDLg, an upper insulating layer INS2g, and a capping pattern CPPg in an area corresponding to an area AA' of FIG. 4A.

Referring to FIGS. 19 and 20, the descriptions of first opening OP1g of the FIG. 20 may be substantially the same as the descriptions of the first opening OP1f of the FIG. 19. The capping pattern CPPg may have a size smaller than a size of the capping pattern CPPf of FIG. 19. As an example, the capping pattern CPPg of FIG. 20 may have a shape obtained by removing a portion of the capping pattern CPPf, which overlaps the connection wiring CN, shown in FIG. 19. FIG. 20 shows the capping pattern CPPg having the shape obtained by removing a portion of a quadrangular shape as a representative example. The capping pattern CPPg may have a shape designed to readily dissipate a gas generated from the upper insulating layer INS2g. As the size of the capping pattern CPPg decreases, the gas generated from the upper insulating layer INS2g may be readily dissipated without being blocked by the capping pattern CPPg.

A size of a second opening OP2g of the pixel definition layer PDLg of FIG. 20 may be smaller than the size of the second opening OP2f of FIG. 19. As an example, the second opening OP2g of FIG. 20 may have a shape obtained by removing a portion of the second opening OP2f, which overlaps the connection wiring CN, shown in FIG. 19. FIG. 20 shows the second opening OP2g having the shape obtained by removing a portion of a quadrangular shape as a representative example. The pixel definition layer PDLg may have the shape designed to improve the resolution of the display panel DP-1 (refer to FIG. 7). As the size of the second opening OP2g decreases, the size of the light emitting opening OP-PDL (refer to FIG. 7) may increase, and the area in which the pixel is disposed may be more secured in the display panel DP-1. As a result, the resolution of the display panel DP-1 may be improved.

FIGS. 19 and 20 show the structures in which the capping pattern CPPf or CPPg is present as a representative example, however, the shape of the second opening OP2 (refer to FIG. 5) of the pixel definition layer PDL (refer to FIG. 5) may be changed to secure the above-mentioned effects in the display panel DP (refer to FIG. 5) that does not include the capping pattern CPPf or CPPg.

Figure 21:
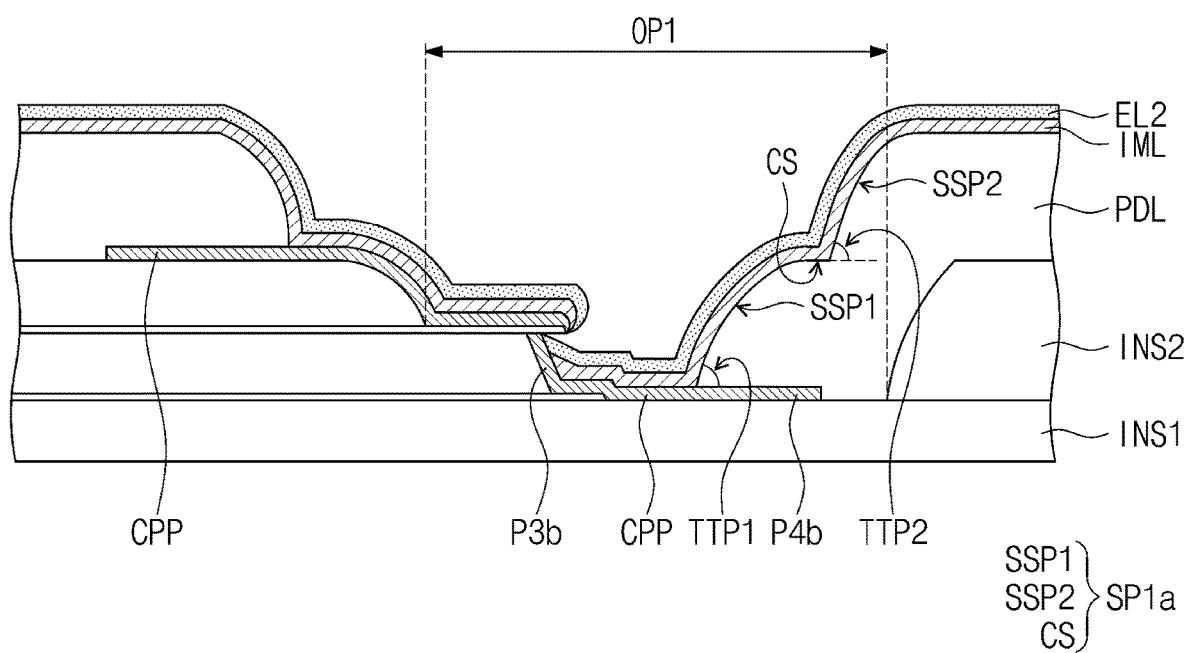
FIG. 21 is a schematic cross-sectional view of a portion of a display panel according to an embodiment.

FIG. 21 is a schematic cross-sectional view of a portion of a display panel according to an embodiment. In FIG. 21, the same reference numerals denote the same elements in FIG. 10, and thus, detailed descriptions of the same elements may be omitted.

Referring to FIG. 21, a pixel definition layer PDL may include a first slant surface SP1a having a stepped shape. The first slant surface SP1a may include a first side slant surface SSP1, a connection surface CS, and a second side slant surface SSP2. The capping pattern CPP may include a third portion P3b adjacent to a side surface of the connection wiring CN and a fourth portion P4b spaced apart from the connection wiring CN. The first side slant surface SSP1 may be a portion that covers a second portion P4b of a capping pattern CPP, the connection surface CS may be a portion that extends from the first side slant surface SSP1 to be parallel to an upper surface of a lower insulating layer INS1, and the second side slant surface SSP2 may be a portion that extends from the connection surface CS.

A taper angle TTP1 of the first side slant surface SSP1 may be different from a taper angle TTP2 of the second side slant surface SSP2. The pixel definition layer PDL having the stepped shape may be formed by using a half tone mask or changing a position at which an upper insulating layer INS2 is formed. As an example, in case that the pixel definition layer PDL is formed using the half tone mask, an amount of a light transmitting through an area adjacent to the first side slant surface SSP1 may be greater than an amount of a light transmitting through an area adjacent to the second side slant surface SSP2. In case that the pixel definition layer PDL is formed by changing the position at which the upper insulating layer INS2 is formed, the upper insulating layer INS2 may be formed to allow a width of the first opening OP1 to become wider, and the pixel definition layer PDL may be formed on the lower insulating layer INS1 and the upper insulating layer INS2. As a result, the pixel definition layer PDL may have the stepped shape.

Although embodiments have been described, it is understood that the disclosure should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the disclosure shall be determined according to the attached claims.

What is claimed is:
1. A display panel comprising:
   a transistor;
   a light emitting device electrically connected to the transistor;
   a connection wiring electrically connecting the transistor to the light emitting device and comprising side surfaces;
   a capping pattern disposed on the transistor and contacting at least one side surface among the side surfaces, the capping pattern electrically connecting the light emitting device to the connection wiring;
   an upper insulating layer disposed on the transistor and including a first opening that overlaps the at least one side surface; and a pixel definition layer disposed on the upper insulating layer and covering part of the first opening of the upper insulating layer.

2. The display panel of claim 1, wherein
a side surface among the side surfaces is exposed by the first opening, and
the capping pattern contacts the one side surface among the side surfaces.

3. The display panel of claim 1, wherein the capping pattern comprises:
a first portion contacting the at least one side surface among the side surfaces; and
a second portion that does not overlap the upper insulating layer.

4. The display panel of claim 3, wherein
the pixel definition layer comprises:
a first slant surface defined in the pixel definition layer covering the second portion of the capping pattern; and
a second slant surface defined in the pixel definition layer disposed on the upper insulating layer, and
a first angle between the upper insulating layer and the first slant surface is greater than a second angle between the upper insulating layer and the second slant surface.

5. The display panel of claim 3, wherein
the pixel definition layer comprises a slant surface having a stepped shape, and
the slant surface comprises:
a first side slant surface defined in the pixel definition layer covering the second portion of the capping pattern;
a connection surface extending from the first side slant surface; and
a second side slant surface extending from the connection surface.

6. The display panel of claim 5, wherein a taper angle of the first side slant surface is different from a taper angle of the second side slant surface.

7. The display panel of claim 1, wherein
two side surfaces among the side surfaces are exposed by the first opening, and
the capping pattern contacts the two side surfaces.

8. The display panel of claim 7, wherein the two side surfaces are connected.

9. The display panel of claim 7, wherein the two side surfaces are spaced apart from each other in a first direction and extend in a second direction intersecting the first direction.

10. The display panel of claim 1, wherein
three side surfaces among the side surfaces are exposed by the first opening, and
the capping pattern contacts the three side surfaces.

11. The display panel of claim 1, wherein
the pixel definition layer includes a second opening overlapping the at least one side surface, and
the capping pattern covers the second opening of the pixel definition layer.

12. A display panel comprising:
a light emitting device;
a transistor electrically connected to the light emitting device;
a connection wiring comprising:
a first connection part electrically connected to the light emitting device and comprising side surfaces; and
a second connection part electrically connected to the transistor;
an upper insulating layer including a first opening that overlaps at least one side surface among the side surfaces;
a capping pattern covering the first connection part and including an electrically conductive material; and
a pixel definition layer covering an edge of the capping pattern.

13. The display panel of claim 12, wherein
the capping pattern comprises:
a first portion contacting the at least one side surface; and
a second portion that does not overlap the upper insulating layer,
the pixel definition layer comprises:
a first slant surface defined in the pixel definition layer covering the second portion of the capping pattern; and
a second slant surface defined in the pixel definition layer disposed on the upper insulating layer, and
a first angle between the upper insulating layer and the first slant surface is greater than a second angle between the upper insulating layer and the second slant surface.

14. The display panel of claim 12, wherein
a side surface among the side surfaces is exposed via the first opening, and
the capping pattern contacts the one side surface.

15. The display panel of claim 12, wherein
the pixel definition layer comprises a slant surface having a stepped shape,
the slant surface comprises:
a first side slant surface defined in the pixel definition layer covering a second portion of the capping pattern;
a connection surface extending from the first side slant surface; and
a second side slant surface extending from the connection surface, and
the first side slant surface has a taper angle different from a taper angle of the second side slant surface.

16. The display panel of claim 12, wherein
two side surfaces connected to each other among the side surfaces are exposed via the first opening, and
the capping pattern contacts the two side surfaces.

17. The display panel of claim 12, wherein
two side surfaces among the side surfaces are exposed via the first opening,
the capping pattern contacts the two side surfaces, and
the two side surfaces are spaced apart from each other in a first direction and extend in a second direction intersecting the first direction.

18. The display panel of claim 12, wherein
three side surfaces among the side surfaces are exposed by the first opening, and
the capping pattern contacts the three side surfaces.

19. A display panel comprising:
a transistor;
a light emitting device electrically connected to the transistor;
a connection wiring electrically connecting the transistor to the light emitting device and comprising side surfaces;
a lower insulating layer disposed on the transistor;
an upper insulating layer disposed on the lower insulating layer and including a first opening that overlaps at least one side surface among the side surfaces of the connection wiring; and a pixel definition layer disposed on the upper insulating layer, wherein the pixel definition layer comprises:
- a first slant surface covering a portion of the first opening; and
- a second slant surface disposed on the upper insulating layer, and a first angle between the lower insulating layer and the first slant surface is greater than a second angle between the upper insulating layer and the second slant surface, and a third angle between an upper surface of the lower insulating layer and a side surface of the upper insulating layer is equivalent to the second angle.

20. The display panel of claim 19, further comprising:
a capping pattern disposed on the lower insulating layer and contacting at least one side surface among the side surfaces.

\* \* \* \* \*